US010900341B2

(12) United States Patent
Brannigan et al.

(10) Patent No.: US 10,900,341 B2
(45) Date of Patent: Jan. 26, 2021

(54) BORE PENETRATION DATA MATCHING

(71) Applicant: Schlumberger Technology Corporation, Sugar Land, TX (US)

(72) Inventors: James Brannigan, Cypress, TX (US); Eimund Liland, Sugar Land, TX (US); Suresh Veeragoni, Houston, TX (US)

(73) Assignee: Schlumberger Technology Corporation, Sugar Land, TX (US)

( * ) Notice: Subject to any disclaimer, the term of this patent is extended or adjusted under 35 U.S.C. 154(b) by 229 days.

(21) Appl. No.: 15/752,414

(22) PCT Filed: Jul. 27, 2016

(86) PCT No.: PCT/US2016/044132
§ 371 (c)(1),
(2) Date: Feb. 13, 2018

(87) PCT Pub. No.: WO2017/030756
PCT Pub. Date: Feb. 23, 2017

(65) Prior Publication Data
US 2019/0003297 A1 Jan. 3, 2019

Related U.S. Application Data

(60) Provisional application No. 62/205,356, filed on Aug. 14, 2015.

(51) Int. Cl.
*E21B 44/00* (2006.01)
*G06F 17/50* (2006.01)
(Continued)

(52) U.S. Cl.
CPC ............... *E21B 44/00* (2013.01); *E21B 7/00* (2013.01); *G01V 1/50* (2013.01); *G06F 17/18* (2013.01); *G06F 30/20* (2020.01); *G06K 9/6215* (2013.01)

(58) Field of Classification Search
CPC .. E21B 44/00; E21B 7/00; G01V 1/50; G06F 17/18; G06F 30/20; G06K 9/6215
(Continued)

(56) References Cited

U.S. PATENT DOCUMENTS

2002/0198891 A1   12/2002   Li et al.
2006/0235666 A1   10/2006   Assa et al.
(Continued)

FOREIGN PATENT DOCUMENTS

CN   103790583 A   5/2014
CN   103792155 A   5/2014

OTHER PUBLICATIONS

Extended Search Report for the equivalent European patent application 16837470.0 dated Mar. 7, 2019.
(Continued)

*Primary Examiner* — John H Le
(74) *Attorney, Agent, or Firm* — Alec J. McGinn

(57) ABSTRACT

A system can include a processor; memory accessible by the processor; a network interface; and processor-executable instructions stored in the memory to instruct the system where the instructions include instructions to receive time series data associated with a borehole; compute a similarity metric for at least a portion of the time series data with respect to other time series data for the borehole; and analyze the similarity metric with respect to at least one operation associated with the borehole.

18 Claims, 22 Drawing Sheets

(51) Int. Cl.
  *G01V 1/50*      (2006.01)
  *G06F 17/18*     (2006.01)
  *G06K 9/62*      (2006.01)
  *E21B 7/00*      (2006.01)
  *G06F 30/20*     (2020.01)

(58) Field of Classification Search
  USPC ....... 702/6, 9–12, 14, 179, 180, 181; 703/10
  See application file for complete search history.

(56) References Cited

U.S. PATENT DOCUMENTS

| | | | |
|---|---|---|---|
| 2010/0042327 A1* | 2/2010 | Garvey | E21B 47/00 |
| | | | 702/11 |
| 2014/0351183 A1* | 11/2014 | Germain | G06N 20/00 |
| | | | 706/12 |
| 2015/0073715 A1 | 3/2015 | Aarre | |
| 2015/0176393 A1 | 6/2015 | Chok et al. | |
| 2016/0333673 A1* | 11/2016 | Anno | G05B 15/02 |

OTHER PUBLICATIONS

International Search Report and Written Opinion issued in International Patent application PCT/US2016/044132, dated Nov. 4, 2016. 15 pages.
Wang, Zhihua. Time Series Matching: a Multi-filter Approach. Dissertation, Courant Institute of Mathematical Sciences, New York University. Jan. 2006. 109 pages.
International Preliminary Report on Patentability for the equivalent International patent application PCT/US2016/044132 dated Mar. 3, 2018.

\* cited by examiner

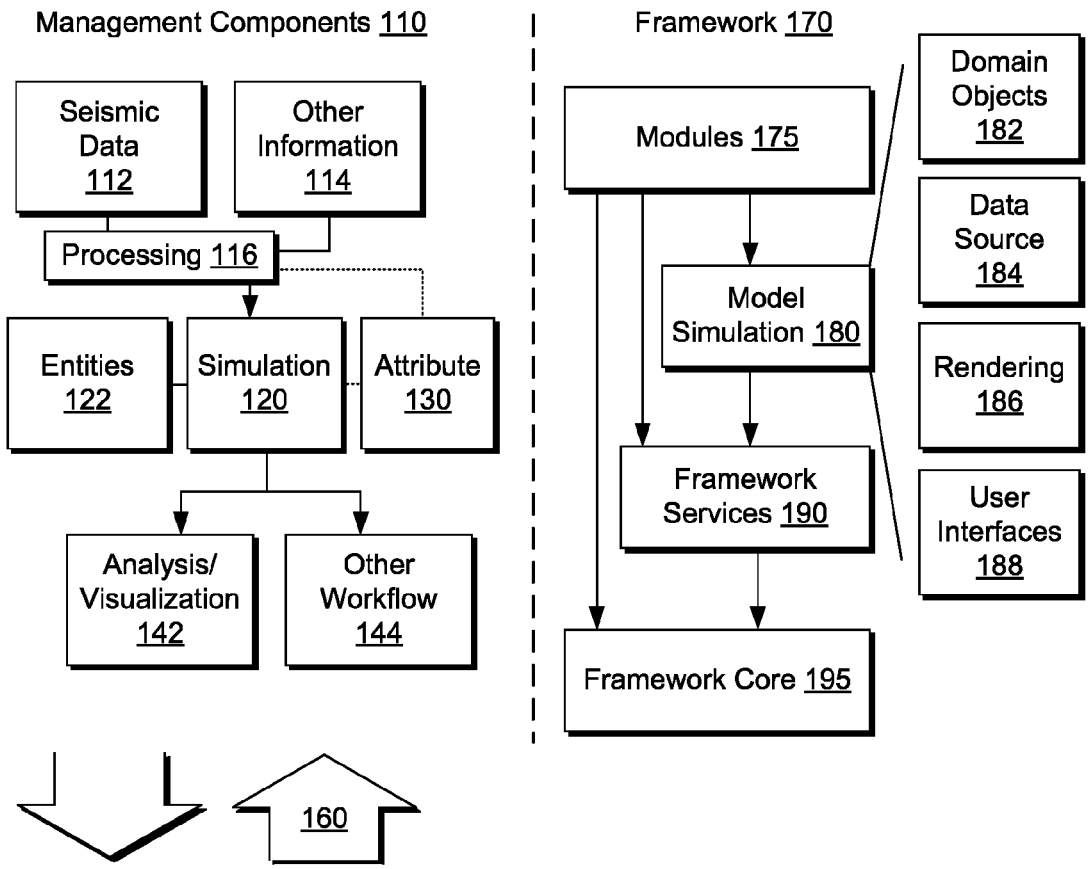
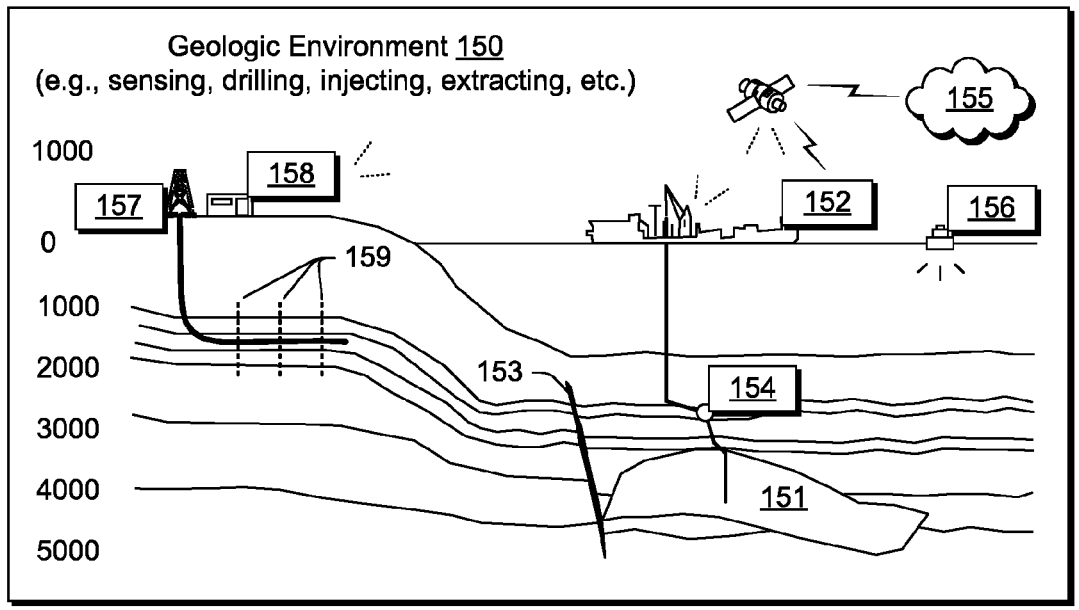
Fig. 1

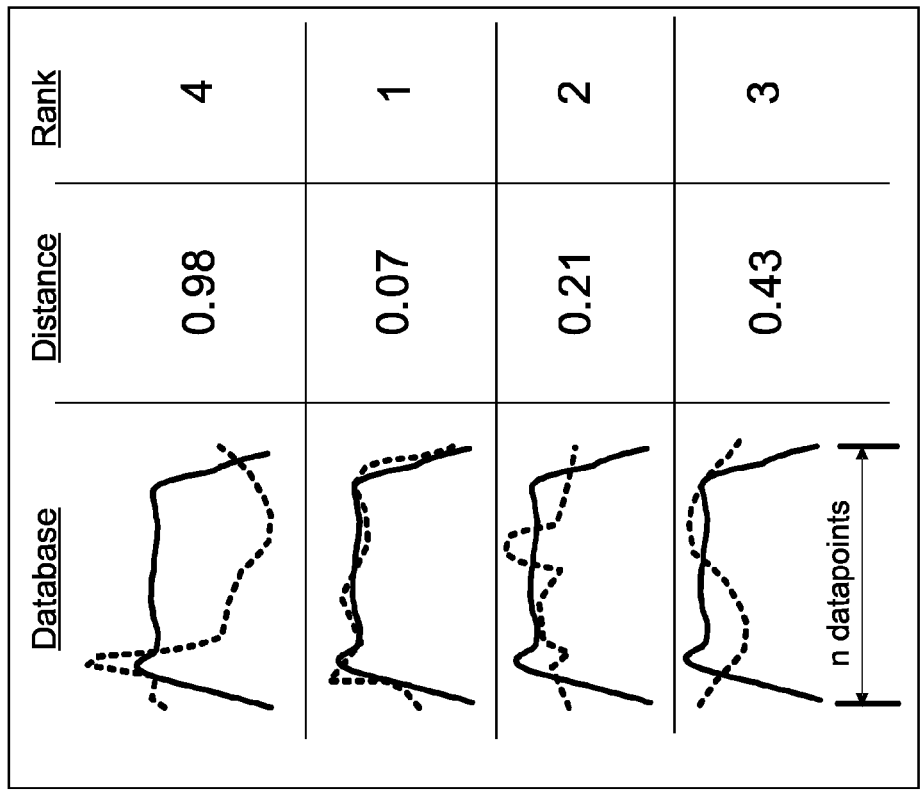
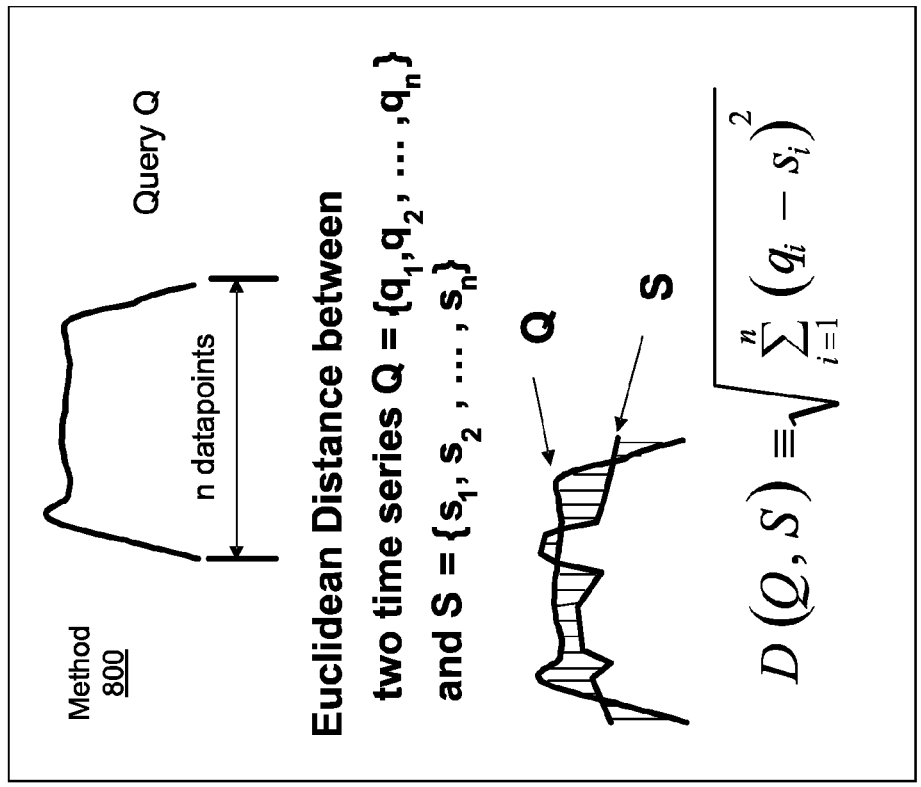
Fig. 8

Method 1000
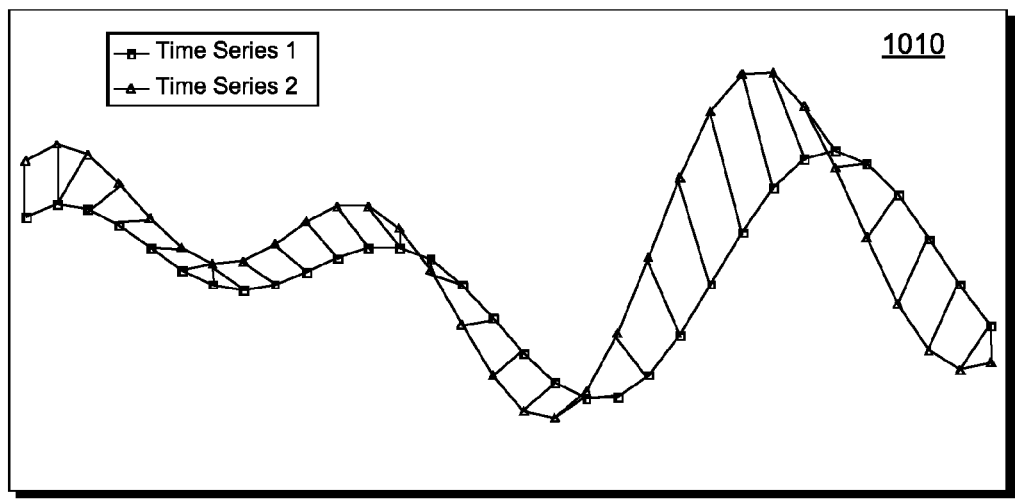
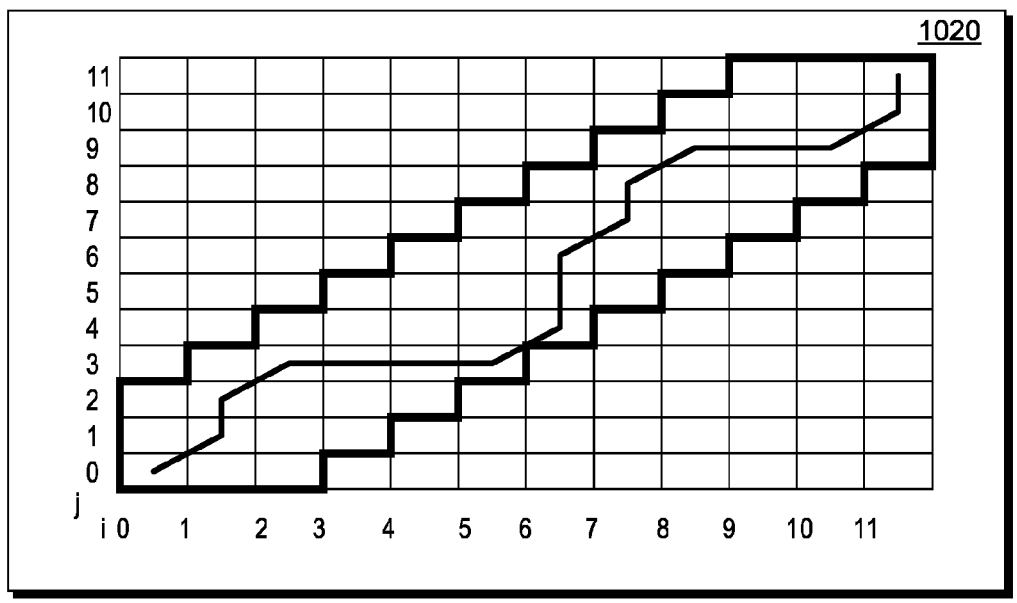
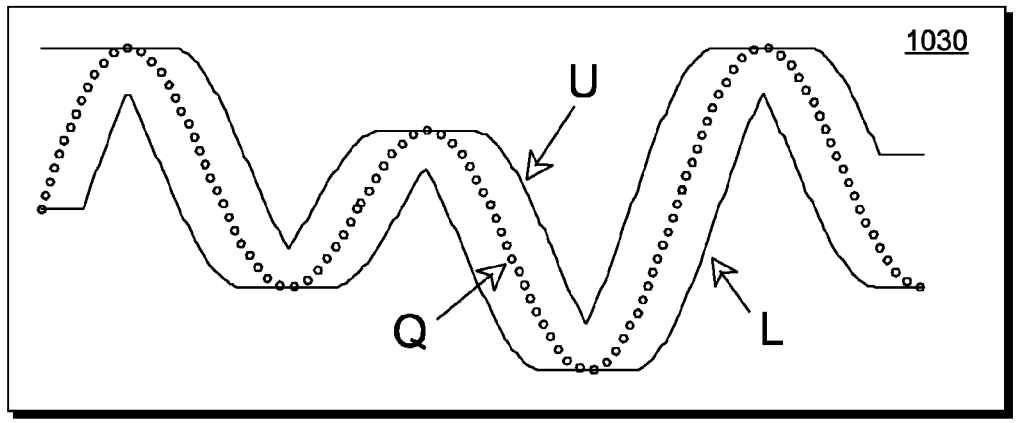
Fig. 10

The k-LDTW between two time series x, y         1110

$$D_{LDTW(k)}(x, y) = D_{c(k)}(First(x), First(y))$$

$$+ \min \begin{cases} D_{LDTW(k)}(x, Rest(y)) \\ D_{LDTW(k)}(y, Rest(x)) \\ D_{LDTW(k)}(Rest(x), Rest(y)) \end{cases}$$

where $$D_{c(k)}(x_i, y_i) = \begin{cases} |D(x_i, y_i)| & \text{if } |i - j| \leq k \\ \text{infinite} & \text{if } |i - j| > k \end{cases}$$

and |x| is the absolute value of x

1130

```
Given a query time series q
    // set minimum distance to infinity
    minDis=infinity
    for all candidates x in database
    {       disLevelOne = transformedEnvDis(q, x)
            // transformed envelope filter check
            if (disLevelOne < minDis)
            {       disLevelTwo = envDis(q, x)
                    // envelope filter check
                    if (disLevelTwo < minDis)
                    {       disLastLevel = DTWDis(q, x)
                            // true DTW distance check
                            if (disLastLevel < minDis)
                            {       // found a better match
                                    besMatch = x
                                    // update the minimum distance
                                    minDis = disLastLevel
                            } //if at last level
                    } // if at level two
            } // if at level one
    } // for
```

Fig. 11

Method 1200

Receive Time Series Data Pairs
1210

$S = \{(q_1, r_1), (q_2, r_2), \ldots (q_n, r_n)\}$

Where
 Each $r_i = \{r_i(0), r_i(1), \ldots r_i(l_i)\}$ is a time series reference of finite length $l_i$; $r = Ur_i$ for $i = 1, 2, \ldots N,$ Each $q_i = \{q_i(0), q_i(1), \ldots q_i(h_i)\}$ is a time series query of finite length $h_i$; $q = Uq_i$ for $i = 1, 2, \ldots N,$ The $r_i$ is considered the best match to $q_i$

For a query q, Assume Function Match(q), for q in Database
1220

Provide Algorithm G for Matching (e.g., and threshold k)
1230

$G(q_i) = p1, p2, \ldots, pk$
1240

Find G: G OK on $q_i$ if $r_i$ Belongs to $G(q_i)$
1250

Fig. 12

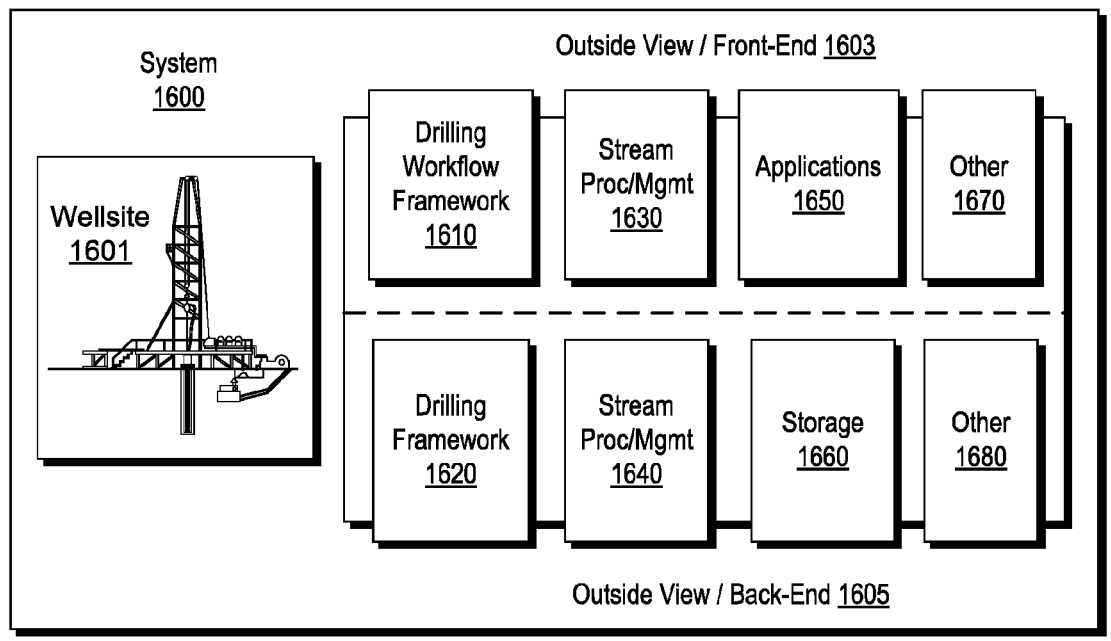
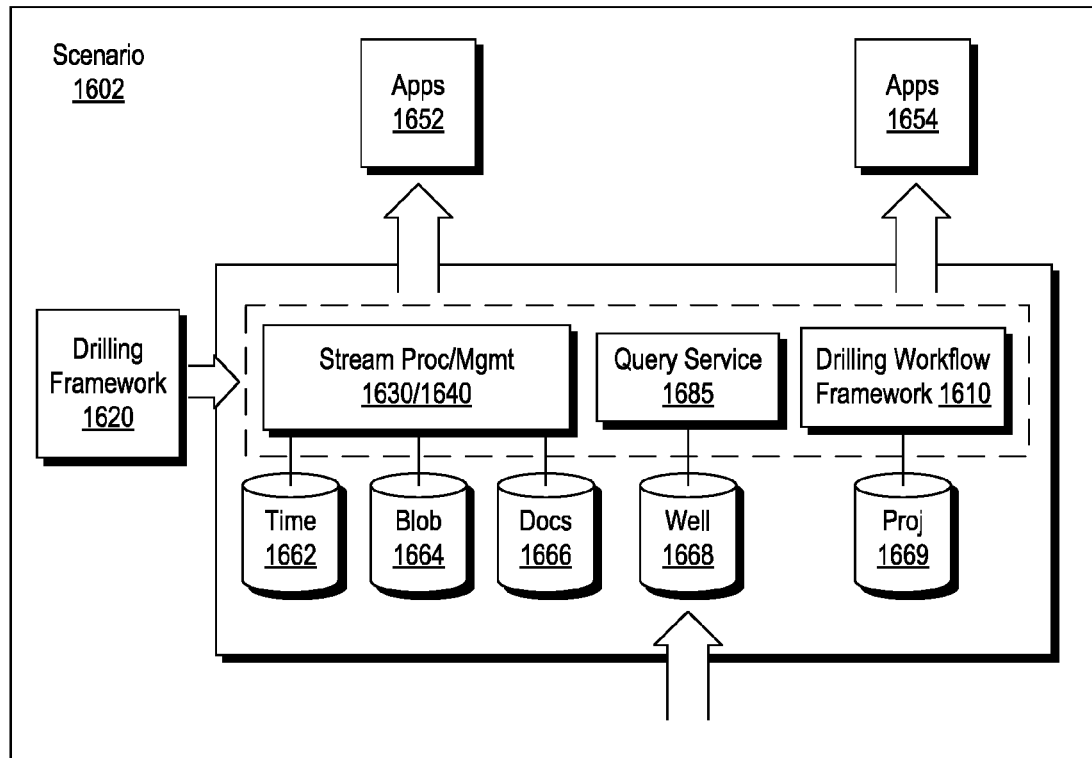
Fig. 16

BORE PENETRATION DATA MATCHING

RELATED APPLICATIONS

This application claims priority to and the benefit of a U.S. Provisional Application having Ser. No. 62/205,356, filed 14 Aug. 2015, which is incorporated by reference herein.

BACKGROUND

A borehole may be a bore of a well (e.g., a wellbore), which may be cased, uncased, etc. A borehole may be characterized by its size and defined by a medium or media that surrounds the borehole. For example, a borehole may be formed by drilling into rock where a rock face defines the drilled hole (e.g., the borehole). As an example, a borehole may be formed directionally, for example, via a technique such as directional drilling. A directionally drilled borehole may deviate from vertical along one or more portions of the borehole. For example, a portion of a borehole may be drilled intentionally at an angle other than vertical. Various operations are associated with drilling. Physical and other constraints can effect drilling and other operations that may be associated with one or more boreholes drilled in a geologic environment.

SUMMARY

A system can include a processor; memory accessibly by the processor; a network interface; and processor-executable instructions stored in the memory to instruct the system where the instructions include instructions to receive time series data associated with a borehole; compute a similarity metric for at least a portion of the time series data with respect to other time series data for the borehole; and analyze the similarity metric with respect to at least one operation associated with the borehole. A method can include receiving time series data from a first source associated with an operation for a borehole; receiving time series data from a second source associated with an operation for the borehole; computing a similarity metric based at least in part on a portion of the time series data from the first source and based at least in part on a portion of the time series data from the second source; and matching at least a portion of the time series data from the first source to at least a portion of the time series data from the second source based at least in part on the similarity metric. Various other apparatuses, systems, methods, etc., are also disclosed.

This summary is provided to introduce a selection of concepts that are further described below in the detailed description. This summary is not intended to identify key or essential features of the claimed subject matter, nor is it intended to be used as an aid in limiting the scope of the claimed subject matter.

BRIEF DESCRIPTION OF THE DRAWINGS

Features and advantages of the described implementations can be more readily understood by reference to the following description taken in conjunction with the accompanying drawings.

FIG. 1 illustrates an example of a geologic environment and an example of a technique;

FIG. 8 illustrates an example of a data association method;

FIG. 10 illustrates an example of a data association method;

FIG. 11 illustrates examples of data association techniques;

FIG. 12 illustrates an example of a data association method;

FIG. 16 illustrates an example of a system and an example of a scenario;

DETAILED DESCRIPTION

Figure 2:
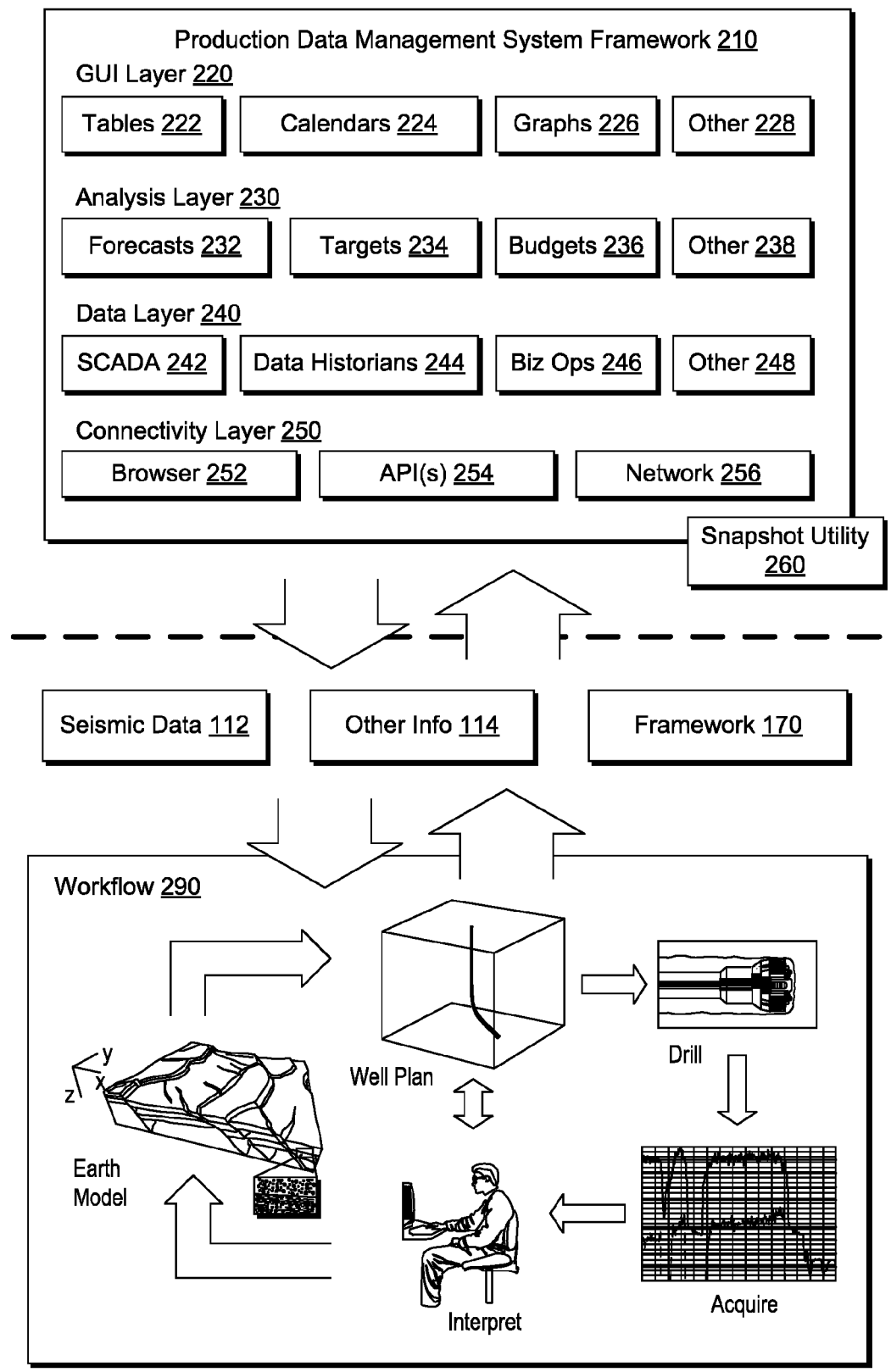
FIG. 2 illustrates an example of a production data management system framework.

The following description includes the best mode presently contemplated for practicing the described implementations. This description is not to be taken in a limiting sense, but rather is made merely for the purpose of describing the general principles of the implementations. The scope of the described implementations should be ascertained with reference to the issued claims.

As mentioned, a borehole may be a bore of a well (e.g., a wellbore), which may be cased, uncased, etc. A borehole may be characterized by its size and defined by a medium or media that surrounds the borehole. For example, a borehole may be formed by drilling into rock where a rock face defines the drilled hole (e.g., the borehole). As an example, a borehole may be formed directionally, for example, via a technique such as directional drilling. A directionally drilled borehole may deviate from vertical along one or more portions of the borehole. For example, a portion of a borehole may be drilled intentionally at an angle other than vertical. Horizontal drilling, as a subset of directional drilling, may refer to drilling that results in a departure of a borehole from vertical, for example, exceeding about 80 degrees. As an example, a horizontal borehole may, for example, after reaching about 90 degrees horizontal (e.g., as measured from vertical), deviate upward. In such cases, the angle past 90 degrees may be continued (e.g., as in 95 degrees, rather than reporting it as deviation from vertical, which would then be 85 degrees).

As an example, one or more completion operations may be performed with respect to a borehole. For example, in drilling operations completions may aim to facilitate production of hydrocarbons. As an example, consider equipment such as a packer on tubing above an openhole completion (e.g., "barefoot" completion), a system of mechanical filtering elements outside of perforated pipe, an automated measurement and control system (e.g., an "intelligent" completion), etc.

As an example, one or more completion operations may be referred to as well completions. As an example, a well completion may be an assembly of downhole tubulars and equipment that aims to provide for production from an oil and/or gas well. As an example, a completion may be specified as occurring at a depth in a borehole, which may depend on type and design of a well. Various options can exist as to equipment, operations, etc., which may be performed during a construction phase of a well. The nature of a completion or completions can have an effect on productivity of a well.

As an example, one or more completions may be particular to a borehole in a shale formation. Completion equipment and completion operations can include event and equipment that aim to bring a well into production, for example, once drilling operations have been concluded. As an example, completion equipment and completion operations can include fracturing such as, for example, hydraulic fracturing (e.g., for recovery of resources from shale reservoirs, etc.).

FIG. 1 shows an example of a system 100 that includes various management components 110 to manage various aspects of a geologic environment 150 (e.g., an environment that includes a sedimentary basin, a reservoir 151, one or more fractures 153, etc.). For example, the management components 110 may allow for direct or indirect management of sensing, drilling, injecting, extracting, etc., with respect to the geologic environment 150. In turn, further information about the geologic environment 150 may become available as feedback 160 (e.g., optionally as input to one or more of the management components 110).

In the example of FIG. 1, the management components 110 include a seismic data component 112, an additional information component 114 (e.g., well/logging data), a processing component 116, a simulation component 120, an attribute component 130, an analysis/visualization component 142 and a workflow component 144. In operation, seismic data and other information provided per the components 112 and 114 may be input to the simulation component 120.

In an example embodiment, the simulation component 120 may rely on entities 122. Entities 122 may include earth entities or geological objects such as wells, surfaces, reservoirs, etc. In the system 100, the entities 122 can include virtual representations of actual physical entities that are reconstructed for purposes of simulation. The entities 122 may include entities based on data acquired via sensing, observation, etc. (e.g., the seismic data 112 and other information 114). An entity may be characterized by one or more properties (e.g., a geometrical pillar grid entity of an earth model may be characterized by a porosity property). Such properties may represent one or more measurements (e.g., acquired data), calculations, etc.

In an example embodiment, the simulation component 120 may operate in conjunction with a software framework such as an object-based framework. In such a framework, entities may include entities based on pre-defined classes to facilitate modeling and simulation. A commercially available example of an object-based framework is the MICROSOFT™ .NET™ framework (Redmond, Wash.), which provides a set of extensible object classes. In the .NET™ framework, an object class encapsulates a module of reusable code and associated data structures. Object classes can be used to instantiate object instances for use by a program, script, etc. For example, borehole classes may define objects for representing boreholes based on well data. A model of a basin, a reservoir, etc. may include one or more boreholes where a borehole may be, for example, for measurements, injection, production, etc. As an example, a borehole may be a wellbore of a well, which may be a completed well (e.g., for production of a resource from a reservoir, for injection of material, etc.).

In the example of FIG. 1, the simulation component 120 may process information to conform to one or more attributes specified by the attribute component 130, which may include a library of attributes. Such processing may occur prior to input to the simulation component 120 (e.g., consider the processing component 116). As an example, the simulation component 120 may perform operations on input information based on one or more attributes specified by the attribute component 130. In an example embodiment, the simulation component 120 may construct one or more models of the geologic environment 150, which may be relied on to simulate behavior of the geologic environment 150 (e.g., responsive to one or more acts, whether natural or artificial). In the example of FIG. 1, the analysis/visualization component 142 may allow for interaction with a model or model-based results (e.g., simulation results, etc.). As an example, output from the simulation component 120 may be input to one or more other workflows, as indicated by a workflow component 144.

As an example, the simulation component 120 may include one or more features of a simulator such as the ECLIPSE™ reservoir simulator (Schlumberger Limited, Houston Tex.), the INTERSECT™ reservoir simulator (Schlumberger Limited, Houston Tex.), the VISAGE™ geomechanics simulator (Schlumberger Limited, Houston Tex.), the PETROMOD™ petroleum systems simulator (Schlumberger Limited, Houston Tex.), the PIPESIM™ network simulator (Schlumberger Limited, Houston Tex.), etc. The ECLIPSE™ simulator includes numerical solvers that may provide simulation results such as, for example, results that may predict dynamic behavior for one or more types of reservoirs, that may assist with one or more development schemes, which may assist with one or more production schemes, etc. The VISAGE™ simulator includes finite element numerical solvers that may provide simulation results such as, for example, results as to compaction and subsidence of a geologic environment, well and completion integrity in a geologic environment, cap-rock and fault-seal integrity in a geologic environment, fracture behavior in a geologic environment, thermal recovery in a geologic environment, $CO_2$ disposal, etc. The PETROMOD™ simulator includes finite element numerical solvers that may provide simulations results such as, for example, results as to structural evolution, temperature, and pressure history and as to effects of such factors on generation, migration, accumulation, and loss of oil and gas in a petroleum system through geologic time. Such a simulator can provide properties such as, for example, gas/oil ratios (GOR) and API gravities, which may be analyzed, understood, and predicted as to a geologic environment. The PIPESIM™ simulator includes solvers that may provide simulation results such as, for example, multiphase flow results (e.g., from a reservoir to a wellhead and beyond, etc.), flowline and surface facility performance, etc. The PIPESIM™ simulator may be integrated, for example, with the AVOCET™ production operations framework (Schlumberger Limited, Houston Tex.). As an example, a reservoir or reservoirs may be simulated with respect to one or more enhanced recovery techniques (e.g., consider a thermal process such as SAGD, etc.).

In an example embodiment, the management components 110 may include features of a commercially available framework such as the PETREL™ seismic to simulation software framework (Schlumberger Limited, Houston, Tex.). The PETREL™ framework provides components that allow for optimization of exploration and development operations. The PETREL™ framework includes seismic to simulation software components that can output information for use in increasing reservoir performance, for example, by improving asset team productivity. Through use of such a framework, various professionals (e.g., geophysicists, geologists, and reservoir engineers) can develop collaborative workflows and integrate operations to streamline processes (e.g., with respect to one or more geologic environments, etc.). Such a framework may be considered an application (e.g., executable using one or more devices) and may be considered a data-driven application (e.g., where data is input for purposes of modeling, simulating, etc.).

In an example embodiment, various aspects of the management components 110 may include add-ons or plug-ins that operate according to specifications of a framework environment. For example, a commercially available framework environment marketed as the OCEAN™ framework environment (Schlumberger Limited, Houston, Tex.) allows for integration of add-ons (or plug-ins) into a PETREL™ framework workflow. The OCEAN™ framework environment leverages .NET™ tools (Microsoft Corporation, Redmond, Wash.) and offers stable, user-friendly interfaces for efficient development. In an example embodiment, various components may be implemented as add-ons (or plug-ins) that conform to and operate according to specifications of a framework environment (e.g., according to application programming interface (API) specifications, etc.).

FIG. 1 also shows an example of a framework 170 that includes a model simulation layer 180 along with a framework services layer 190, a framework core layer 195 and a modules layer 175. The framework 170 may include the commercially available OCEAN™ framework where the model simulation layer 180 is the commercially available PETREL™ model-centric software package that hosts OCEAN™ framework applications. In an example embodiment, the PETREL™ software may be considered a data-driven application. The PETREL™ software can include a framework for model building and visualization. Such a model may include one or more grids.

The model simulation layer 180 may provide domain objects 182, act as a data source 184, provide for rendering 186 and provide for various user interfaces 188. Rendering 186 may provide a graphical environment in which applications can display their data while the user interfaces 188 may provide a common look and feel for application user interface components.

In the example of FIG. 1, the domain objects 182 can include entity objects, property objects and optionally other objects. Entity objects may be used to geometrically represent wells, surfaces, reservoirs, etc., while property objects may be used to provide property values as well as data versions and display parameters. For example, an entity object may represent a well where a property object provides log information as well as version information and display information (e.g., to display the well as part of a model).

In the example of FIG. 1, data may be stored in one or more data sources (or data stores, generally physical data storage devices), which may be at the same or different physical sites and accessible via one or more networks. The model simulation layer 180 may be configured to model projects. As such, a particular project may be stored where stored project information may include inputs, models, results and cases. Thus, upon completion of a modeling session, a user may store a project. At a later time, the project can be accessed and restored using the model simulation layer 180, which can recreate instances of the relevant domain objects.

In the example of FIG. 1, the geologic environment 150 may include layers (e.g., stratification) that include a reservoir 151 and that may be intersected by a fault 153. As an example, the geologic environment 150 may be outfitted with any of a variety of sensors, detectors, actuators, etc. For example, equipment 152 may include communication circuitry to receive and to transmit information with respect to one or more networks 155. Such information may include information associated with downhole equipment 154, which may be equipment to acquire information, to assist with resource recovery, etc. Other equipment 156 may be located remote from a well site and include sensing, detecting, emitting or other circuitry. Such equipment may include storage and communication circuitry to store and to communicate data, instructions, etc. As an example, one or more satellites may be provided for purposes of communications, data acquisition, etc. For example, FIG. 1 shows a satellite in communication with the network 155 that may be configured for communications, noting that the satellite may additionally or alternatively include circuitry for imagery (e.g., spatial, spectral, temporal, radiometric, etc.).

FIG. 1 also shows the geologic environment 150 as optionally including equipment 157 and 158 associated with a well that includes a substantially horizontal portion that may intersect with one or more fractures 159. For example, consider a well in a shale formation that may include natural fractures, artificial fractures (e.g., hydraulic fractures) or a combination of natural and artificial fractures. As an example, a well may be drilled for a reservoir that is laterally extensive. In such an example, lateral variations in properties, stresses, etc. may exist where an assessment of such variations may assist with planning, operations, etc. to develop a laterally extensive reservoir (e.g., via fracturing, injecting, extracting, etc.). As an example, the equipment 157 and/or 158 may include components, a system, systems, etc. for fracturing, seismic sensing, analysis of seismic data, assessment of one or more fractures, etc.

As mentioned, the system 100 may be used to perform one or more workflows. A workflow may be a process that includes a number of worksteps. A workstep may operate on data, for example, to create new data, to update existing data, etc. As an example, a may operate on one or more inputs and create one or more results, for example, based on one or more algorithms. As an example, a system may include a workflow editor for creation, editing, executing, etc. of a workflow. In such an example, the workflow editor may provide for selection of one or more pre-defined worksteps, one or more customized worksteps, etc. As an example, a workflow may be a workflow implementable in the PETREL™ software, for example, that operates on seismic data, seismic attribute(s), etc. As an example, a workflow may be a process implementable in the OCEAN™ framework. As an example, a workflow may include one or more worksteps that access a module such as a plug-in (e.g., external executable code, etc.).

FIG. 2 shows an example of a production data management system framework 210, which includes a graphical user interface (GUI) layer 220, an analysis layer 230, a data layer 240 and a connectivity layer 250 as well as a snapshot utility 260 (e.g., or bookmark utility). As an example, the production data management system framework 210 may receive information such information associated with one or more components of the example of FIG. 1. For example, FIG. 2 shows the production data management system framework 210 as receiving the seismic data 112 and the other information 114 as well as being interoperable with the framework 170. As an example, such a framework may include features for interoperability with one or more items of the geologic environment 150.

FIG. 2 also shows an example of a workflow 290, which can include providing an earth model, generating a well plan, drilling, acquiring information (e.g., optionally while drilling), interpreting (e.g., via machine, human, human and machine), optionally adjusting the well plan and optionally adjusting the earth model. Such a workflow may be operatively coupled to a framework such as the framework 170 and/or the production data management system framework 210 and, for example, may optionally receive and/or transmit information.

In the example of FIG. 2, as to the framework 210, the GUI layer 220 includes a tables module 222, a calendars module 224, a graphs module 226 and one or more other modules 228; the analysis layer 230 includes a forecasts module 232, a targets module 234, a budgets module 236 and one or more other modules 238; the data layer 240 includes a SCADA module 240, a data historians module 244, a business operations module 246 and one or more other modules 248; and the connectivity layer 250 includes a browser module 252, an application programming interface (API) module 254 and a network module 256. In the example of FIG. 2, the utility 260 may be part of the framework 210 or may be an add-in, a plug-in, etc.

As an example, a production data management systems framework may benefit field staff, production and reservoir engineers, production accountants, administrators, etc. One or more graphical user interfaces may be contextualized to view asset performance, monitor performance indicators, visualize relevant information that can affect production, impact performance, etc. As an example, performance metrics may be visualized, including allocated production against plan for a full portfolio of assets. As an example, a programming framework may support access to a production data management system framework, for example, via a network (e.g., the Internet) for data entry, validation, contextualization, viewing of information (e.g., in the field, office, mobile device, etc., where underlying platforms, operating systems, etc., may differ). As an example, a system may include a framework configured with one or more modules (e.g., code, plug-ins, APIs, etc.) to leverage any of a variety of resources.

Figure 3:
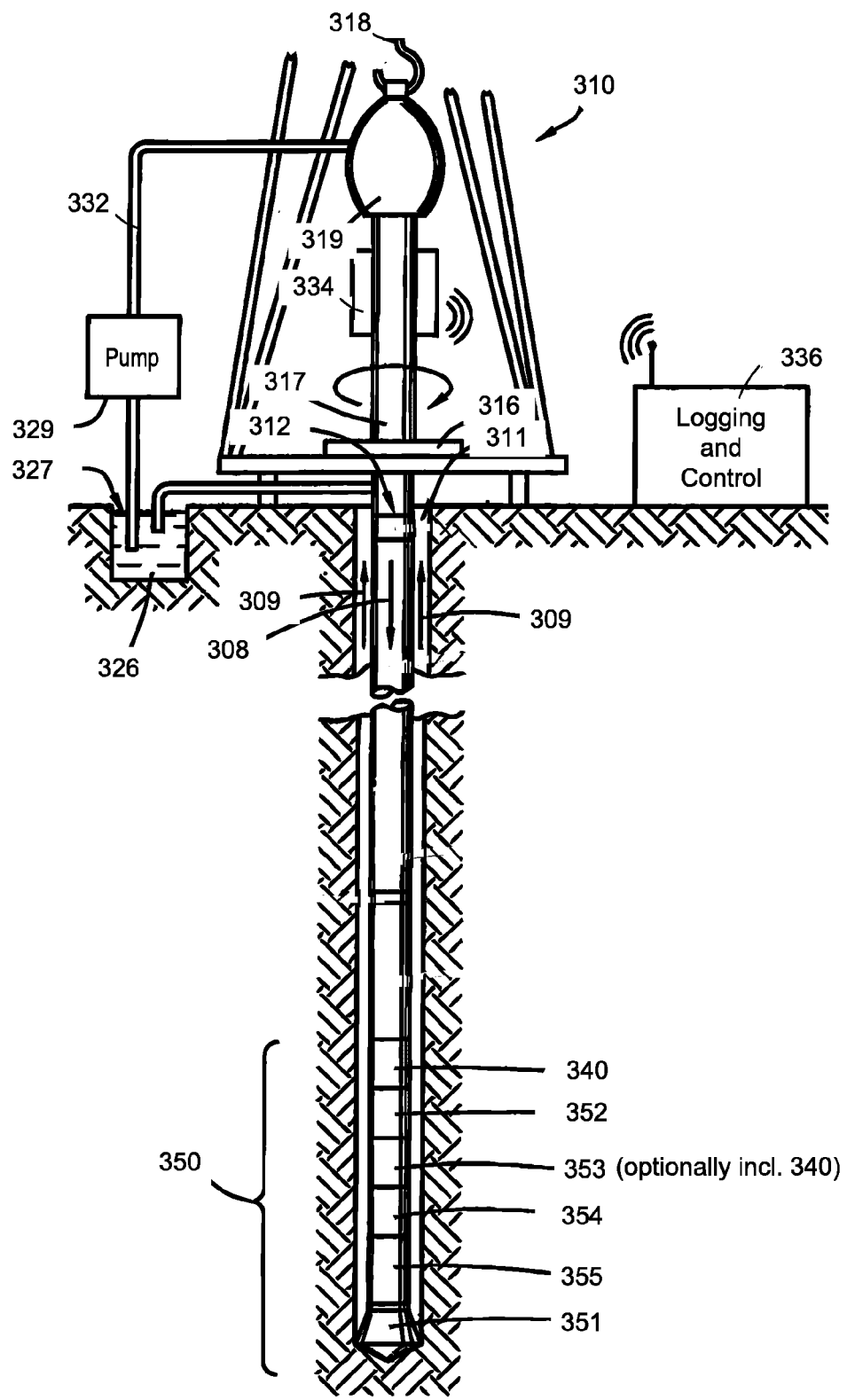
FIG. 3 illustrates an example of a geologic environment and examples of equipment.

FIG. 3 shows a wellsite system (e.g., at a wellsite that may be onshore or offshore). In the example system of FIG. 3, a borehole 311 is formed in subsurface formations by rotary drilling; noting that various example embodiments may also use directional drilling. As shown, a drill string 312 is suspended within the borehole 311 and has a bottom hole assembly 350 that includes a drill bit 351 at its lower end. A surface system provides for operation of the drill string 312 and other operations and includes platform and derrick assembly 310 positioned over the borehole 311, the assembly 310 including a rotary table 316, a kelly 317, a hook 318 and a rotary swivel 319. As indicated by an arrow, the drill string 312 can be rotated by the rotary table 316, energized by means not shown, which engages the kelly 317 at the upper end of the drill string 312. The drill string 312 is suspended from a hook 318, attached to a traveling block (not shown), through the kelly 217 and a rotary swivel 319 which permits rotation of the drill string 312 relative to the hook 318. As an example, a top drive system may be suitably used.

In the example of FIG. 3, the surface system further includes drilling fluid (e.g., mud, etc.) 326 stored in a pit 327 formed at the wellsite. As an example, a wellbore may be drilled to produce fluid, inject fluid or both (e.g., hydrocarbons, minerals, water, etc.). In the example of FIG. 3, the drill string 312 (e.g., including one or more downhole tools) may be composed of a series of pipes threadably connected together to form a long tube with the drill bit 351 at the lower end thereof. As the drill tool 312 is advanced into a wellbore for drilling, at some point in time prior to or coincident with drilling, the drilling fluid 326 may be pumped by a pump 329 from the pit 327 (e.g., or other source) via a line 232 to a port in the swivel 319 to a passage (e.g., or passages) in the drill string 312 and out of ports located on the drill bit 351 (see, e.g., a directional arrow 308). As the drilling fluid 226 exits the drill string 312 via ports in the drill bit 351, it then circulates upwardly through an annular region between an outer surface(s) of the drill string 312 and surrounding wall(s) (e.g., open borehole, casing, etc.), as indicated by directional arrows 309. In such a manner, the drilling fluid 326 lubricates the drill bit 351 and carries heat energy (e.g., frictional or other energy) and formation cuttings to the surface where the drilling fluid 326 (e.g., and cuttings) may be returned to the pit 327, for example, for recirculation (e.g., with processing to remove cuttings, etc.).

The drilling fluid 326 pumped by the pump 329 into the drill string 312 may, after exiting the drill string 312, form a mudcake that lines the wellbore which, among other functions, may reduce friction between the drill string 312 and surrounding wall(s) (e.g., borehole, casing, etc.). A reduction in friction may facilitate advancing or retracting the drill string 312. During a drilling operation, the entire drill string 312 may be pulled from a wellbore and optionally replaced, for example, with a new or sharpened drill bit, a smaller diameter drill string, etc. The act of pulling a drill string out of a hole or replacing it in a hole is referred to as tripping. A trip may be referred to as an upward trip or an outward trip or as a downward trip or an inward trip depending on trip direction.

As an example, consider a downward trip where upon arrival of the drill bit 351 of the drill string 312 at a bottom of a wellbore, pumping of the drilling fluid 326 commences to lubricate the drill bit 351 for purposes of drilling to enlarge the wellbore. As mentioned, the drilling fluid 326 is pumped by pump 329 into a passage of the drill string 312 and, upon filling of the passage, the drilling fluid 326 may be used as a transmission medium to transmit energy, for example, energy that may encode information as in mud-pulse telemetry.

As an example, mud-pulse telemetry equipment may include a downhole device configured to effect changes in pressure in the drilling fluid 326 to create an acoustic wave or waves upon which information may modulated. In such an example, information from downhole equipment (e.g., one or more modules of the drill string 312) may be transmitted uphole to an uphole device 334, which may relay such information to other equipment 336 for processing, control, etc.

As an example, the drill string 312 may be fitted with telemetry equipment 340 that may include a rotatable drive shaft, a turbine impeller mechanically coupled to the drive shaft such that the drilling fluid 326 can cause the turbine impeller to rotate, a modulator rotor mechanically coupled to the drive shaft such that rotation of the turbine impeller causes said modulator rotor to rotate, a modulator stator mounted adjacent to or proximate to the modulator rotor such that rotation of the modulator rotor relative to the modulator stator creates pressure pulses in the drilling fluid 326, and a controllable brake for selectively braking rotation of the modulator rotor to modulate pressure pulses. In such example, an alternator may be coupled to the aforementioned drive shaft where the alternator includes at least one stator winding electrically coupled to a control circuit to selectively short the at least one stator winding to electromagnetically brake the alternator and thereby selectively brake rotation of the modulator rotor to modulate the pressure pulses in the drilling fluid 326. In the example of FIG. 3, the uphole device 334 may include circuitry to sense pressure pulses generated by telemetry equipment 340 and, for example, communicate sensed pressure pulses or information derived therefrom to the equipment 336 for process, control, etc.

The bottom hole assembly 350 (BHA) of the illustrated embodiment includes a logging-while-drilling (LWD) module 352, a measuring-while-drilling (MWD) module 353, an optional module 354, a roto-steerable system and motor 355, and the drill bit 351.

The LWD module 352 may be housed in a suitable type of drill collar and can contain one or a plurality of selected types of logging tools. It will also be understood that more than one LWD and/or MWD module can be employed, for example, as represented at by the module 354 of the drill string 312. Where the position of an LWD module is mentioned, as an example, it may refer to a module at the position of the LWD module 352, the module 354, etc. An LWD module can include capabilities for measuring, processing, and storing information, as well as for communicating with the surface equipment. In the illustrated example embodiment of FIG. 3, the LWD module 352 may include a seismic measuring device.

The MWD module 353 may be housed in a suitable type of drill collar and can contain one or more devices for measuring characteristics of the drill string 312 and drill bit 351. As an example, the MWD tool 353 may include equipment for generating electrical power, for example, to power various components of the drill string 312. As an example, the MWD tool 353 may include the telemetry equipment 340, for example, where the turbine impeller can generate power by flow of the drilling fluid 326; it being understood that other power and/or battery systems may be employed for purposes of powering various components. As an example, the MWD module 353 may include one or more of the following types of measuring devices: a weight-on-bit measuring device, a torque measuring device, a vibration measuring device, a shock measuring device, a stick slip measuring device, a direction measuring device, and an inclination measuring device.

Figure 4:
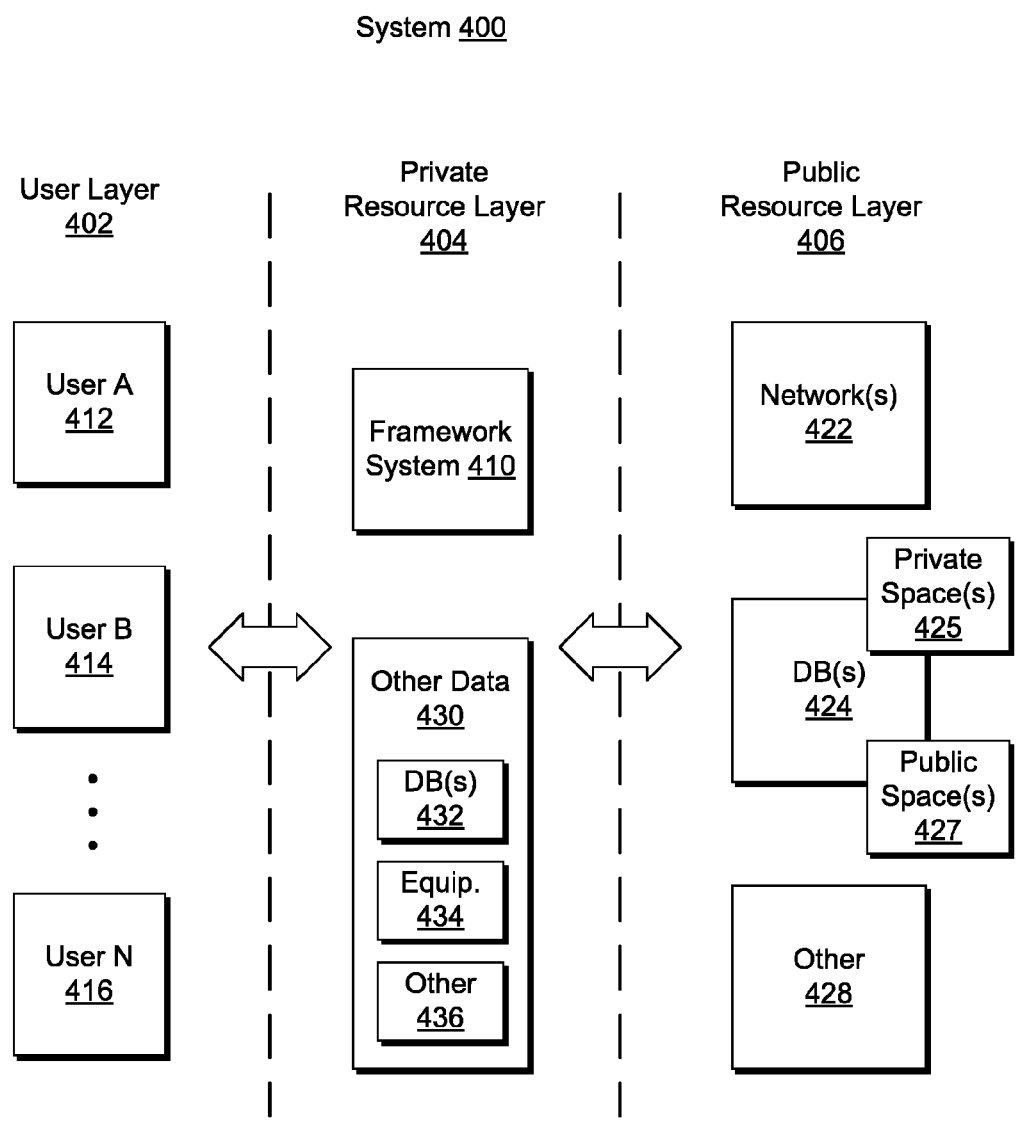
FIG. 4 illustrates an example of a system.

FIG. 4 shows an example of a system that includes a user layer 402, a private resource layer 404 and a public resource layer 406. In the example of FIG. 4, the user layer 402 may include various users 412, 414 and 416 that have permissions or credentials for using a framework system 410 of the private resource layer 404 (e.g., consider a system or systems that may include one or more frameworks, simulators, etc.), and optionally accessing other data 430, which may be considered private or proprietary. For example, the other data 430 may include data in one or more databases 432, equipment data 434, or other data 436. As to the framework system 410, it may be a model simulation layer such as the layer 180 of the framework 170 and may include one or more of the management components 110 of FIG. 1. As an example, a framework such as the framework 170 may be part of the private resource layer 404 and include private, public or private and public modules configured to interact with the public resource layer 404 and optionally the other data 430 of the private resource layer 404. As to the public resource layer 406, in the example of FIG. 4, it includes one or more networks 422, one or more databases 424, and one or more other sources of information 428. As an example, the one or more databases 424 may include one or more private spaces 425 and one or more public spaces 427. As an example, a private space may be a space reserved for a user where such information is not accessible to another user. As an example, the user may optionally transform the private space or information therein into a public space, for example, such that it becomes accessible to other users (e.g., optionally within an organization, with particular credentials, etc.).

Users of a framework system (e.g., a system for seismology, drilling, completions, modeling, simulation, controlling, injecting, producing, etc.) may benefit from resources that exist in a public resource layer. As an example, consider a user that spends considerable time sitting in front of a display and interacting with one or more applications for seismology, drilling, completions, monitoring, modeling, simulating, controlling, injecting, producing, etc. In such an example, an application may be knowledge and data driven and the user may experience productivity challenges when knowledge, data or both are not readily at accessible. To help overcome such challenges, one or more components may integrate public source data to assist a user or users. As an example, when a user desires knowledge or data, the user may invoke a component (e.g., during a monitoring session, a drilling session, a modeling session, etc.) where the component responds by rendering relevant public source data to the display.

As an example, the private resource layer 404 of the system 400 of FIG. 4 may include resources that are private as to individual users (e.g., corporate entities, people, etc.). For example, data in a private resource layer may be data resident on a particular computing machine being used by a user to perform one or more tasks that may be associated with a workflow, etc. As an example, the framework system 410 of the private resource layer 404 of the system 400 of FIG. 4 may be a system installed on a particular computing machine (e.g., or a plurality of machines). For example, a user may use a computing machine that has modules stored to memory that may be executed within an operating system environment established by the computing machine (e.g., one or more processors operatively coupled to the memory). Such a computing machine may further include one or more network interfaces, for example, for accessing data, transmitting data, etc.

As an example, the private resource layer 404 of the system 400 of FIG. 4 may reside at least in part on a computing machine (e.g., a tablet computer, a notebook computer, a desktop computer, a workstation, etc.). As an example, such a computing machine may include a network interface for accessing one or more resources in the public resource layer 406. As an example, the public resource layer 406 may include the one or more private spaces 425, for example, space reserved for users, user projects, etc. As an example, a user (e.g., an entity such as a corporate entity, etc.) may have control over one or more settings that determine whether a private space or information therein is or can become public (e.g., accessible to multiple users), for example, to be in at least one of the one or more public spaces 427.

Figure 5:
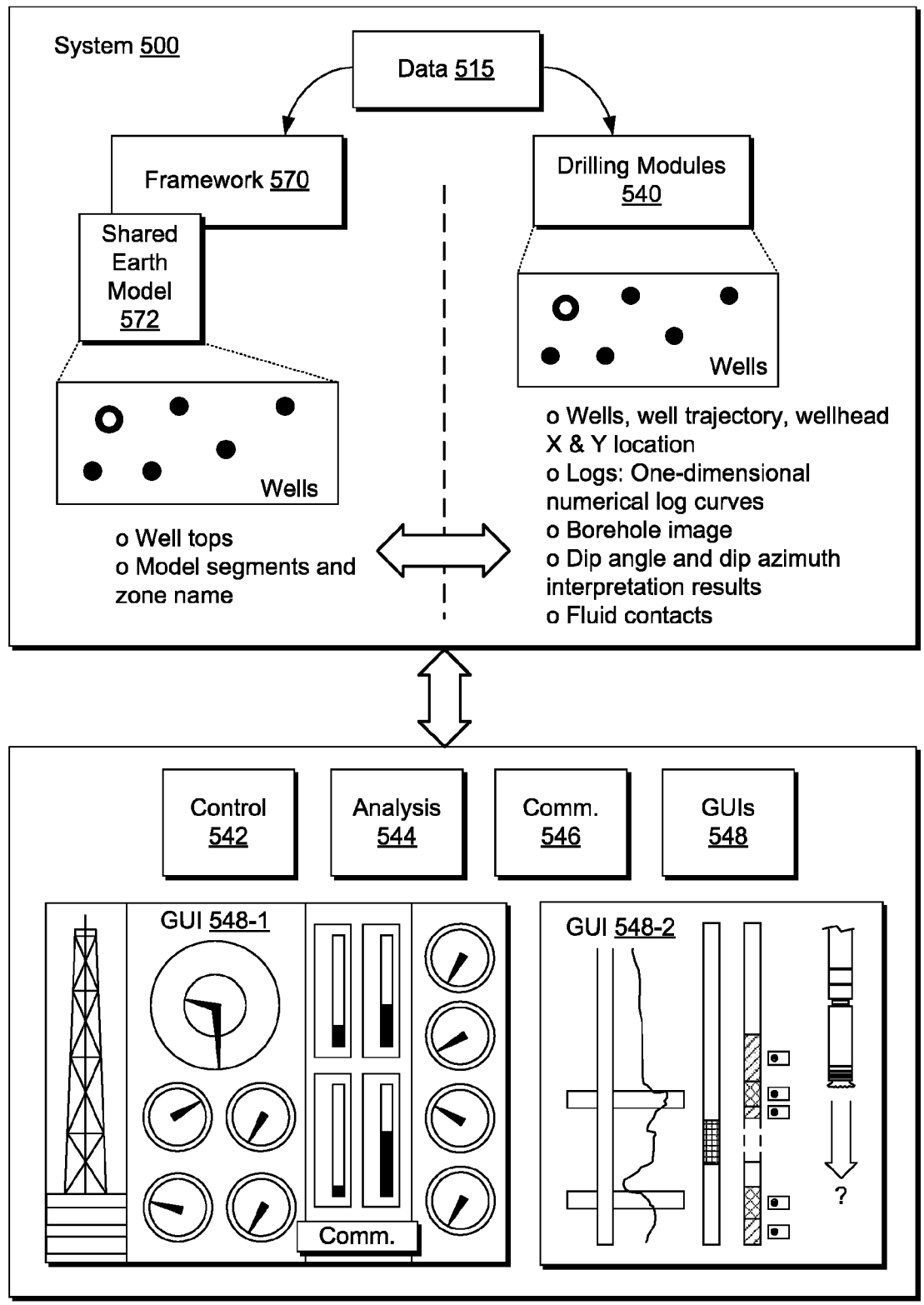
FIG. 5 illustrates an example of a system.

FIG. 5 shows an example of a system 500 that includes data 515, drilling modules 540 and a framework 570, which may be a framework such as the framework 170 of FIG. 1. As to the drilling modules 540, these may include a control module 542, an analysis module 544, a communication module 546 and one or more graphical user interface (GUI) modules 548, for example, to organize data and graphics commands for rendering of a GUI 548-1, a GUI 548-2, etc. In the example of FIG. 5, the GUIs 548-1 and 548-2 provide information relevant to a drilling process where such information may optionally include real time information.

As an example, the drilling modules 540 may include one or more modules of the commercially available TECHLOG™ wellbore framework (Schlumberger Limited, Houston, Tex.), which provides wellbore-centric, cross-domain workflows based on a data management layer. The TECHLOG™ wellbore framework includes features for petrophysics (core and log), geology, drilling, reservoir and production engineering, and geophysics.

As indicated in FIG. 5, information may be exchanged between the framework 570 and the drilling modules 540, optionally using plug-ins, APIs, etc. Such transfers may allow for spatial mapping, temporal mapping or spatial and temporal mapping of data between the framework 570 and the drilling modules 540. As an example, the framework 570 may access information associated with the drilling modules 540 pertaining to wells, well trajectory, wellhead location, logs, borehole images, dip angle and dip azimuth interpretation results, fluid contacts, etc. As an example, the drilling modules may access information associated with the framework 570 pertaining to well tops, model segments and zone name (e.g., for a model that includes one or more grids).

As to the data 515, it may be stored in one or more data storage devices locally, remotely, or locally and remotely. For example, consider data storage options that may exist in a private resource layer and/or a public resource layer (see, e.g., the layers 404 and 406 of FIG. 4). As an example, data may include seismic data, interpreted data, model data, measurement data, qualitative data, etc. Portions of such data may be relevant to the drilling modules 540 directly and/or the framework 570 directly. As shown in the example of FIG. 5, information transfers between the drilling modules 540 and the framework 570 may include other data, for example, acquired from one or more other sources and may include analyzed data (e.g., optionally with respect to a model, etc.).

As an example, the framework 570 and the drilling modules 540 may be stored in memory of computing machine that may be a local computing machine for a user that includes a network interface. In such an example, the network interface may provide for communication of information, for example, to a private space in a public resource. In such an example, the public resource may be accessible to users that possess certain credentials, for example, that, upon authentication, allow for access to public spaces of the public resources (e.g., shared spaces, sharable spaces, etc.). For example, a user at a local computing machine may perform various tasks where a background process executes that transfers information (e.g., deltas, etc.) to a private space in a public resource. In such an example, the user may enter a command, instruction, etc. that causes the information in the private space to become public (e.g., transferred to or changed to a public space of the public resource). In such an example, the background process may provide for serialization of constructs associated with a framework, modules, etc. As an example, the background process may trickle the information to the private space in the public resource. Such a process may operate with a relatively low overhead as to not diminish the user's experience (e.g., not detract noticeably from time of computing, memory fetches, etc. of the user using the framework, modules, etc. on the local computing machine).

As an example, an application framework such as the TECHLOG™ application framework may include a client module such as a STUDIO™ client module for communications with a STUDIO™ server (Schlumberger Limited, Houston, Tex.). As an example, a client module may provide for local data access, remote connection, batching, etc. As an example, a server module (e.g., a STUDIO™ server module) may include features for authentication/authorization, identity service, data access, notifications, etc. As an example, a management module (e.g., a STUDIO™ management module) may include features for workspace management, data cleanup, etc.

As an example, the STUDIO™ framework can include one or more STUDIO™ find application programming interfaces (APIs), a STUDIO™ manager API or APIs, and a STUDIO™ database software development kit (SDK). As an example, the STUDIO™ framework may be implemented in conjunction with the OCEAN™ framework. For example, an SDK may allow a developer to create various plug-ins for the STUDIO™ manager while interacting with data access services, interoperability features, indexing functionality, etc.

Figure 6:
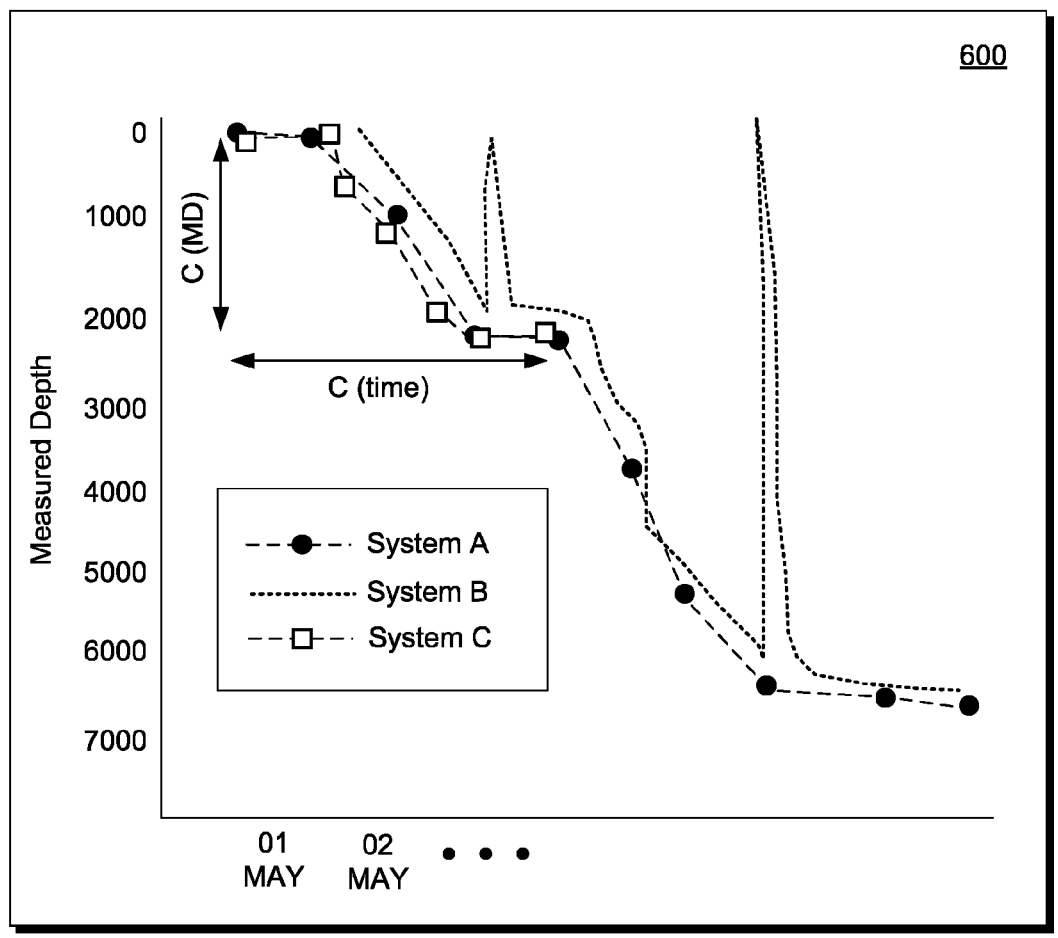
FIG. 6 illustrates an example of a plot of data from different systems.

FIG. 6 shows an example of a plot 600 that includes data with respect to time, which may be considered time-series data. For example, a drilling operation can drill a borehole in a geologic environment over a period of time during which information may be acquired. Such information can be indicative of depth, for example, measured depth of a drill bit.

As mentioned, various types of operations may accompany drilling. One or more of such operations may acquire information. For example, an operation can include acquisition equipment, which may be a system or may be part of a system.

In the example of FIG. 6, the plot 600 shows data sets from three systems, System A, System B and System C (e.g., data sets A, B and C, respectively). As shown for the data set C of System C, the data set C includes an associated time span and depth span that overlap at least one time and/or at least one depth of data set A and data set B. Given an overlapping portion of one data set, an opportunity exists to "match" that portion to another data set and, for example, associate the data sets.

In the example of FIG. 6, the data set B includes data that show excursions, which may be travels into and/or out of a borehole. As an example, a method can include filtering out or otherwise accounting for such data where matching of depth versus time is desired.

As an example, a borehole may have a "fingerprint" as to its depth with respect to time (e.g., drilling operation(s) time). As an example, a pattern or patterns may exist in depth versus time data for a borehole (e.g., data associated with a borehole). Such a pattern or patterns may exist for one or more sets of data, which may be, for example, acquired via one or more systems.

Figure 7:
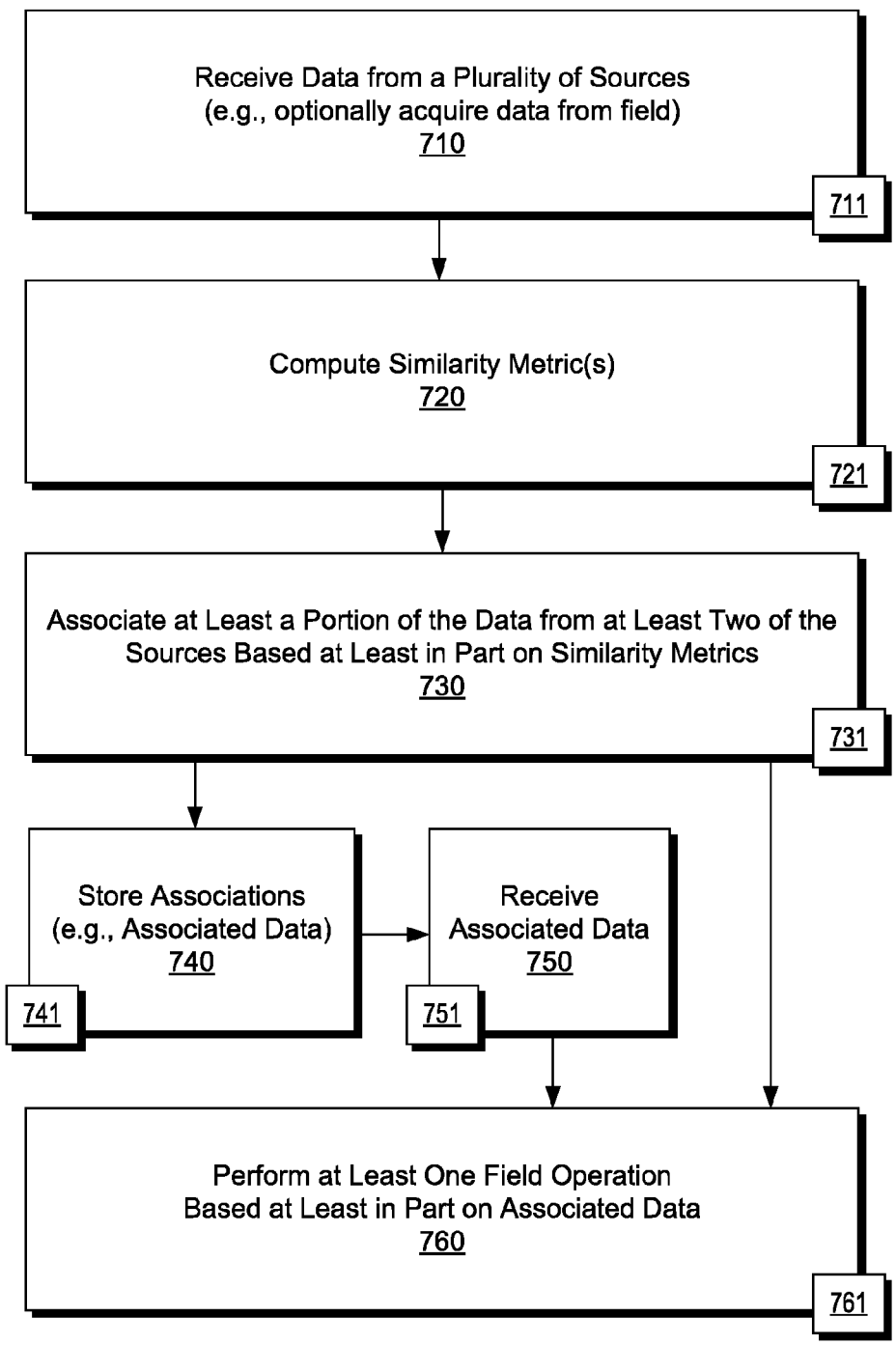
FIG. 7 illustrates an example of a method.

FIG. 7 shows an example of a method 700 that includes a reception block 710 for receiving data from a plurality of sources, a compute block 720 for computing at least one similarity metric, an association block 730 for associating at least a portion of the data from a least two of the sources based at least in part on the similarity metric, a storage block 740 for optionally storing the associations (e.g., associated data), a reception block 750 for receiving associated data (e.g., as may be stored), and a performance block 760 for performing at least one field operation based at least in part on the associated data.

The method 700 is shown in FIG. 7 in association with various computer-readable media (CRM) 711, 721, 731, 741, 751 and 761. Such blocks generally include instructions suitable for execution by one or more processors (or processor cores) to instruct a computing device or system to perform one or more actions. While various blocks are shown, a single medium may be configured with instructions to allow for, at least in part, performance of various actions of the method 700. As an example, a computer-readable medium (CRM) may be a computer-readable storage medium that is non-transitory and that is not a carrier wave.

As an example, a drilling process may include acquiring information as to depth with respect to time. As an example, a method may provide an ability to assemble information about such a process, for example, for effective analysis and improvement of that process. As an example, a drilling process may be performed via a plurality of operations where at least some of the operations may be associated with respective data acquisition systems, techniques, storage devices, sampling rates, etc. As an example, a drilling operation may be performed where record keeping (e.g., information, data, etc.) is non-centralized, which may present a challenge as to assembling drilling data when desired.

As an example, a system can include a wealth of historical data about drilling kept in a plurality of disparate record-keeping systems. As an example, a method can include collecting and organizing such data, for example, to help optimize one or more drilling operations and/or other operations.

As explained with respect to the plot 600 of FIG. 6, an individual system may acquire data that can be represented as a time-depth curve, which, as mentioned, may optionally be treated as time series data.

As an example, an entity (e.g., an organization) can include one or more systems (e.g., morning reporting, etc.) with useful information about drilling. As an example, in drilling a single borehole, a broadly dispersed collection of detailed real time drilling data may be acquired via one or more systems. As an example, a method may include managing such information locally and/or remotely.

As an example, metadata may exist that is linked to data such as time-depth data. For example, metadata may describe how a piece equipment performed during drilling (e.g., measured temperatures, pressures, rotational speeds, etc.). As an example, where time series data are matched, a method may optionally include associating metadata of one system with time depth data of another system (e.g., directly and/or indirectly).

As an example, a method may provide for matching data across two or more record keeping systems. For example, such a method may provide for being able to match a job, a well, a hole section, etc., across two or more systems. Such an approach may be useful for efficient offset research, which may combine one or more legacy systems together to give a more complete picture of a well (e.g., or wells).

As an example, a system may be implemented to associate data where multiple unlinked drilling data repositories exist. As an example, a system may be implemented to associate data where, in an area, a number of wells exist.

As an example, a method can include linking data from a well across different record-keeping systems, for example, to provide for a more complete view of offset data.

As an example, one or more time versus depth drilling performance curves may be used as a "pattern" to match across one or more other different drilling data systems, for example, even at different time resolutions and with potentially missing sections. As an example, a shape of a drilling performance curve may be utilized to match data for a common borehole where the data stem from different systems.

As an example, a method can include extracting date-time bit depth information from a plurality of individual record keeping systems while maintaining identity of the well/job/section from each of the systems. Such a method may include using the shape of one or more curves and approximate locus in time, for example, to match pieces to one another computationally.

As an example, a matching technique can include, for example, one or more algorithms. As an example, a techniques can include, for example, envelope filtering. As an example, a technique may aim to match curves for an entire curve and/or for a portion of a curve.

As an example, a method can include creating an index that links representations of a common well where the representations stem from different systems.

As an example, given a database filled with data from disparate record keeping systems that spans multiple drilling jobs, a method can include identifying what records correspond to the a particular drilling job, for example, so that the data may be appropriately connected (e.g., associated, linked, etc.). One item common to such records can be a time-depth curve, which may exist for a portion of a depth, a portion of time, etc., with respect to an overall operation depth, an overall operation time, etc.

As an example, a method can include probing data to uncover one or more data associations and to store information that associates, links, connects, etc. such data.

As an example, a method can include selecting a similarity metric (e.g., Euclidean distance, etc.); setting a tolerance for error where the tolerance may be small enough to not confuse records between wells, but large enough to identify records within a well (e.g., noting that a tolerance may be found empirically, for example, via experiments with known labeled data); calculating the distance for a plurality of records in a database (e.g., to the probe record); and to associate records within zero plus or minus the error tolerance (e.g., with the probe record). As an example, a distance metric may be scaled, for example, to handle partial records.

As an example, one or more time series databases may exist and/or be created, for example, to store a number of time series. As an example, a method can include making one or more similarity queries with respect to one or more databases. As an example, a query may seek to determine whether an exact match and/or a sub-sequence match exist for data of two or more time series. A method can include specifying one or more match criteria, for example, consider a range approach, a nearest neighbor approach, etc. As an example, a method can include defining a similarity model, for example, consider the following: $D(X,Y)$ for $X=x1, x2, \ldots, xn$, and $Y=y1, y2, \ldots, yn$.

As an example, a similarity technique may be one or more of Euclidean and Lp based; time warping, edit distance and LCS based; probabilistic (e.g., via one or more Markov models); landmark based, etc.

FIG. 8 shows an example of a method 800 that uses Euclidean distance with respect to time series. As shown, a query may be made using a time series where the query asks: is this time series, or one or more portions thereof, matching one or more time series, or one or more portions thereof, in a database or databases. In the example of FIG. 8, the method 800 includes computing distance metrics and ranking based at least in part on the computed distance metrics (e.g., similarity metrics).

As an example, a range query may seek to find time series S where $D(Q,S) \leq \varepsilon$. As an example, a nearest neighbor query may seek to find one or more k most similar time series to Q. As an example, a method may implement a linear scan as a technique.

As an example, a method may implement a GEMINI approach that utilizes one or more filters. Such an approach can aim to extract m features (numbers, averages, statistical measures, etc.) and map into a point in an m-d feature space. As an example, a method may organize points using a spatial access method (SAM) and, for example, retrieve a solution or solutions using SAM. As an example, an approach may include discarding false alarms (e.g., based on one or more criteria, filters, etc.).

As an example, a method can include building an index for a database in a feature space using an R-tree and implementing an algorithm such as RangeQuery(Q, $\varepsilon$). Such an algorithm may project the query Q into a point in the feature space, find one or more candidate objects in the index within e, retrieve one or more sequences, compute distances and, for example, discard false alarms.

As an example, an algorithm may be a nearest neighbor algorithm such as, for example, algorithm K_NNQuery(Q, K). Such an algorithm may project the query Q in a feature space, find one or more candidate K nearest neighbors in the index, retrieve one or more sequences pointed to by the one or more candidates, compute distances and record the maximum. Such an algorithm may include issuing a RangeQuery (Q, emax) and computing distances and maintaining K. As an example, an algorithm may provide one or more solutions subject to a condition such as, for example: $D_{feature}(F(x), F(y)) \leq D(x, y)$.

Figure 9:
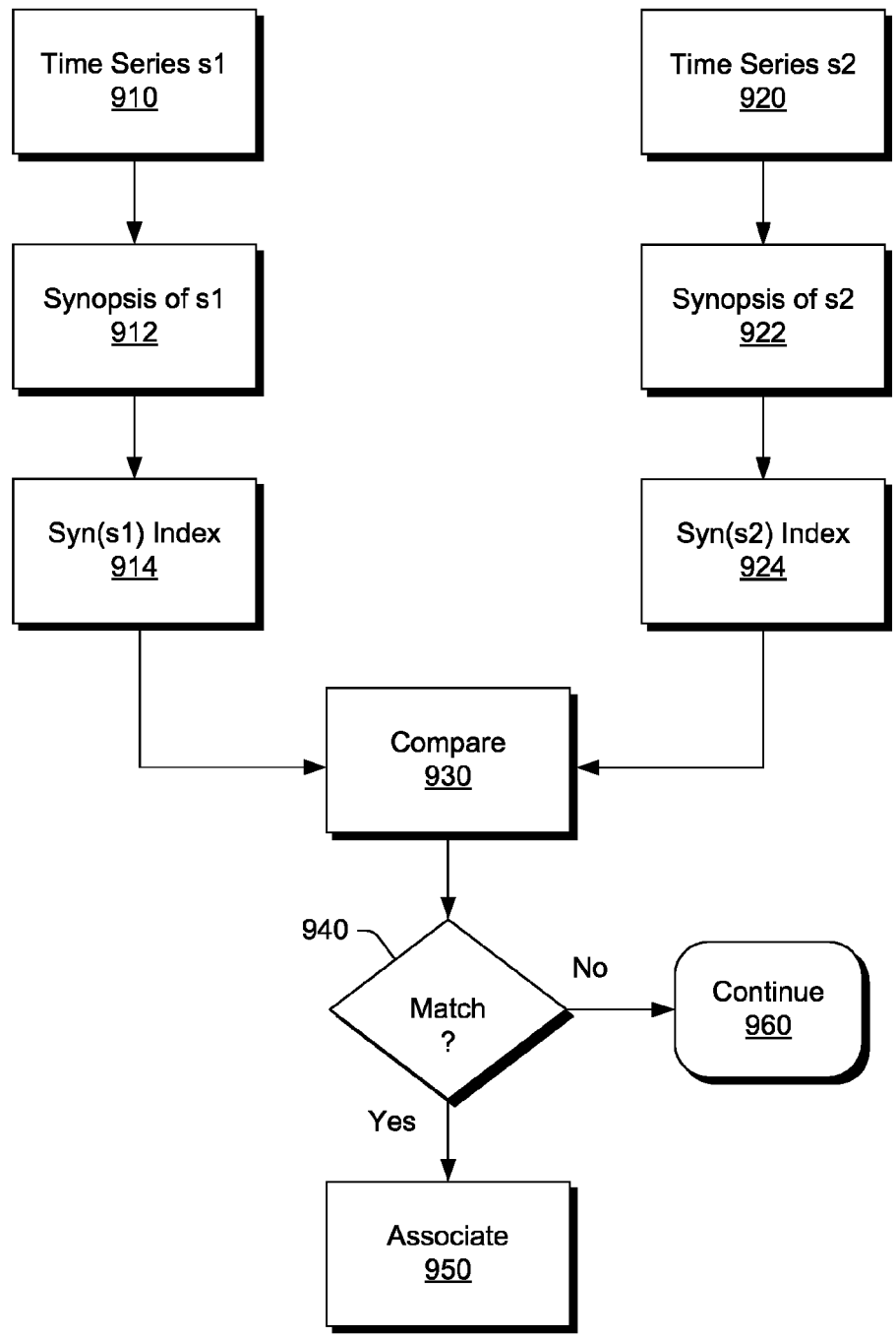
FIG. 9 illustrates an example of a data association method.

FIG. 9 shows an example of a method 900 for associating data of a first time series s1 and data of a second time series s2. The method 900 includes reception blocks 910 and 920 for receiving time series data s1 and s2, compute blocks 912 and 922 for computing a synopsis of s1 and a synopsis of s2, storage blocks 914 and 924 for storing the synopses (e.g., in a multidimensional index structure), a compare block 930 for comparing (e.g., mapping synopses to points in the index), a decision block 940 for deciding whether a match exists (e.g., s1 and s2 can be deemed close if their synopses map to close points in the index), an association block 950 for associating at least a portion of the data of time series s1 to at least a portion of the data of time series s2 where the decision block 940 decides that a match exists (e.g., one or more matches exist) and a continuation block 960 for continuing to one or more actions, terminating the method 900, etc. As an example, an action may be returning to one or more blocks of the method 900, for example, to consider other data (e.g., one or more different time series, one or more other portions of a time series, etc.). The method 900 of FIG. 9 may be considered to be a GEMINI type of algorithm.

As an example, a synopsis can be a lower dimensional representation of data. For example, a method can include implementing one or more data reduction techniques to generate a synopsis. As an example, a synopsis can be a synopsis data structure that is a representation of data (e.g., a data set). As an example, a synopsis can characterize data using one or more succinct representations. As an example, a synopsis can be a characterization of data. As an example, a synopsis data structure may be a random sampling or other type of sampling of a data set. As an example, a synopsis may be utilized for purposes of queries (e.g., searching, etc.). As an example, a synopsis may aim to provide a data structure for a class of queries where such a data structure can provide answers to queries from that class.

As an example, a similarity measure may be a similarity metric. As an example, a similarity measure or a similarity function can be a real-valued function that quantifies the similarity between two objects. As an example, such a measure or function may be a measure of an inverse of distance (e.g., distance metrics). As an example, a similarity measure or similarity function may take on large values for similar objects and either zero or a negative value for very dissimilar objects.

As an example, a similarity metric may be a value that is calculated as a distance, a ratio, etc. for two or more values. For example, an operation at a wellsite can include tripping equipment into a bore and acquiring data in the bore and at the surface. In such an example, a similarity metric may be a ratio of a measured value at the surface to a measured value in the bore (e.g., a downhole value) where the values may be acquired at approximately the same time. In such an example, consider a weight on bit measurement at the surface and a weight on bit measurement downhole (e.g., in the bore). Equipment at a wellsite (e.g., including equipment in a bore) may acquire such measurements with respect to time such that two time series are stored. As an example, a method may include receiving the two time series and calculating one or more similarity metrics (e.g., ratio, difference, etc.) for a plurality of times and/or for a plurality of depths of equipment in the bore, which may correspond to various times. An analysis of such similarity metrics may provide insight as to performance of an operation or operations. As an example, data acquired at a surface location and data acquired at a downhole location in a bore, at a particular time, may be expected to be similar to at least some extent. As an example, a similarity metric may quantify similarities and/or differences.

FIG. 10 shows an example of a method 1000 for a dynamic time warping distance measure approach (DTW). In a plot 1010, two time series are shown, with distances between point pairs. In such an example, the time series may appear similar but differ in not being "close" in Euclidean distance. For example, time series may be out-of-phase with respect to a time axis. As an example, the method 1000 can include alignment shifting between two or more time series (e.g., or portions thereof). In such an example, Euclidean distance may be reduced, which may provide for more robust matching (e.g., where one or more conditions are satisfied to implement shifting, etc.).

In FIG. 10, a plot 1020 illustrates computation of DTW distances for two time series. A procedure to computing DTW distance may be visualized via the plot 1020 as a string matching style dynamic program. For example, for time series x of length n and time series y of length m, an n×m matrix M may be used to align the time series. In such an example, a cell $M_{i,j}$ corresponds to the alignment of element $x_i$ and $y_j$. As an example, a monotonic and continuous path P can form a particular alignment between x and y. As an example, a cell can have a corresponding cost where the sum of costs along a path represents a total cost of a particular alignment. By minimizing the total cost of a path, an optimal alignment may be determined. As an example, one or more constraints may be implemented to constrain "flexibility" of warping.

As an example, in the context of depth and time data associated with a borehole (e.g., borehole depth with respect to time), a constraint may be local or global. As an example, a constraint may be illustrated as a "boundary" in a plot such as the plot 1020. A constraint may appear as a band (e.g., a Sakoe-Chiba band), as a parallelogram (e.g., an Itakura parallelogram), or as another type of feature, which may have physical meaning with respect to one or more drilling operations, a borehole, etc. For example, consider the plot 600 of FIG. 6 where "spikes" exist for in-out travel of instruments. A constraint may aim to avoid warping for such spikes in data.

FIG. 10 also shows a plot 1030 that illustrates an envelope of a time series, which may be implemented, for example, in a filtering approach. For example, consider an approach that implements envelope filtering and/or transformed envelope filtering to index DTW distance. As an example, via use of enveloping, a DTW approach may be amenable to indexing (e.g., to index DTW distance). In the example plot 1030 of FIG. 10, for the time series Q, a lower envelope L and an upper envelope U are shown. As an example, a k-envelope distance may be determined between two time series. As an example, an envelope distance may be utilized as a filter to filter out one or more possible candidates.

FIG. 11 shows a block 1110 as an example of a k-LDTW distance for time series x and y. FIG. 11 also shows a block 1130 as an example of pseudo code for an adaptive multi-level filter algorithm (e.g., for a nearest neighbor query). As an example, a method may implement a k-LDTW approach, a multi-level filter approach and/or one or more other approaches.

FIG. 12 shows an example of a method 1200 that includes a reception block 1210 for receiving time series data pairs, a query block 1220 for querying a database, a provision block 1230 for providing an algorithm G for matching (e.g., an a threshold k), a definition block 1240 for defining G as a function of q with respect to p1, p2, . . . , pk, and a determination block 1250 for finding G where G is deemed suitable (e.g., "OK") on q if $r_i$ belongs to G(q). Such an approach may be referred to as a time series matching framework approach. For example, such an approach is described in Wang, "Time Series Matching: a Multi-filter Approach", PhD Dissertation, New York University (2006), which is incorporated by reference herein.

Figure 13:
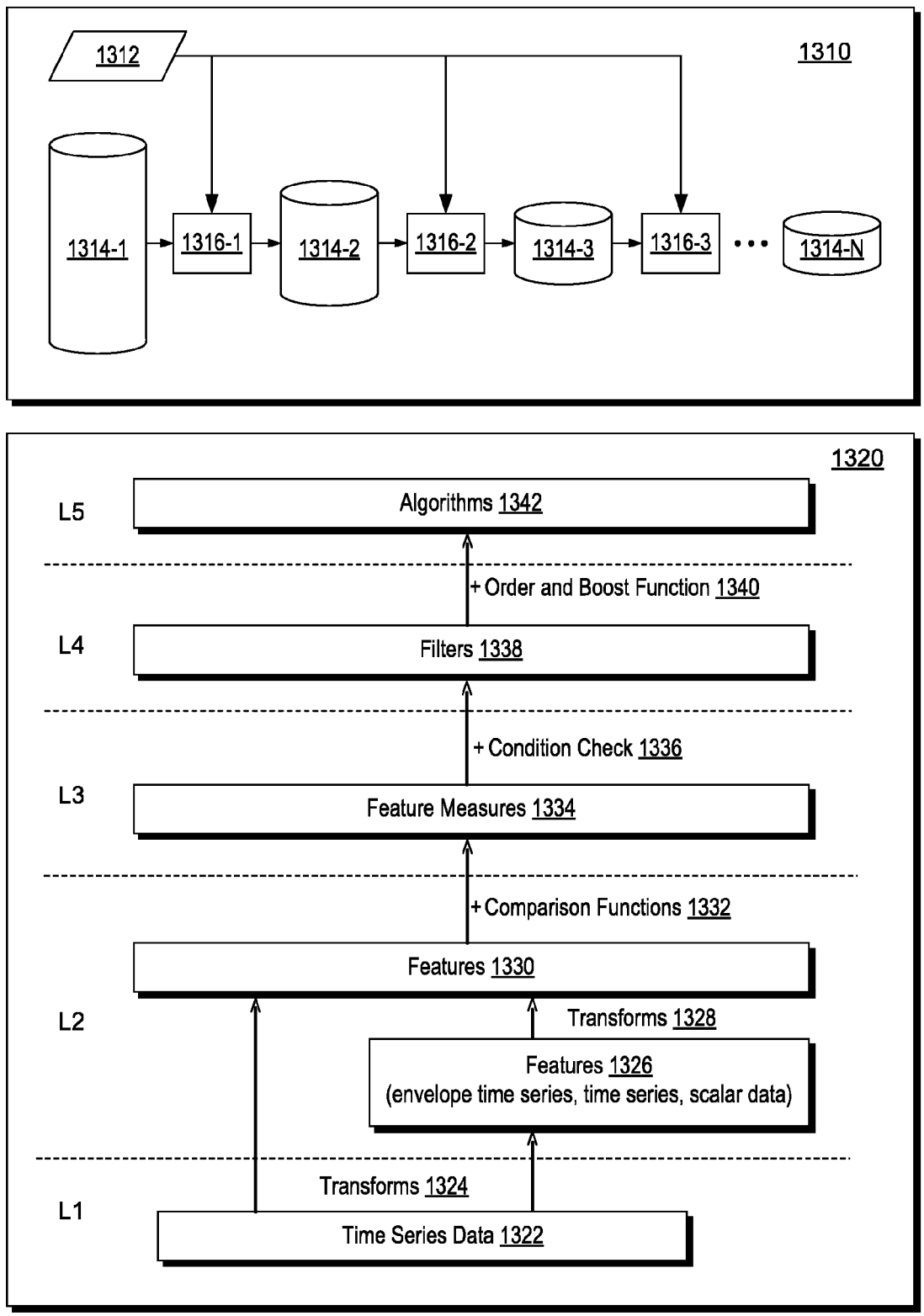
FIG. 13 illustrates an example of a data association method.

FIG. 13 shows examples of a multi-filter approach in blocks 1310 and 1320. As indicated in the block 1310, query information 1312 can be utilized at least in part in one or more filters 1316-1, 1316-2, 1316-3, etc., that can be applied to various sets of candidates 1314-1, 1341-2, 1314-3, etc., to arrive at one or more final candidates 1314-N.

As indicated in the block 1320, a framework can include various components, which can include, for example, transformation functions 1324 and 1328, comparison functions 1332, features 1326 and 1330, feature measures 1334, conditions 1336, filters 1338 and algorithms 1342.

As an example, transformation functions can be functions that transform data from one form to another, such as the Discrete Fourier Transform (DFT) that transforms data from a time domain to a frequency domain.

As an example, data may be in one or more forms in the block 1320. As shown, time series data 1322 may be provided to the block 1320. As an example, data can be in a scalar form, a time series form, an envelope time series form or one or more other forms.

As an example, comparison functions can be functions that compare two data items and return a scalar value. For example, a scalar value can be 0 when two data are considered to be equivalent. As an example, a scalar value can be negative or a positive scalar value can mean that a first datum is bigger in a measure's sense and a negative value means the first datum is smaller.

As an example, transformation functions can include functions that can compute feature data from original time series data or other feature data.

As an example, comparison functions, together with feature data, can be or include feature measures. As an example, a comparison function can apply to different feature data to construct different feature measures.

As an example, a condition can function, together with one or more feature measures, to construct one or more filters. As an example, a feature measure having different condition thresholds can forms different filters, for example, one for each threshold.

As mentioned, a multi-filter algorithm may be built based on filters. As an example, at each filter level, an algorithm may implement one or more feature measures to compare certain features of a query and reference data and filters out one or more "bad" reference candidates.

In the example of FIG. 13, the block 1320 can include various levels (e.g., L1 to L5). As shown, the block 1320 include a time series data block 1322, features blocks 1326 and 1330, transformation function blocks 1324 and 1328, comparison functions 1332, feature measures 1334, conditions for condition checking 1336, filters 1338, order and/or boost functions 1340 and algorithms 1342. For example, a framework can include structure and functions where for training data, the framework can be used to build a multi-filter algorithm (e.g., top of block 1320) that can be utilized to perform one or more similarity searches.

Figure 14:
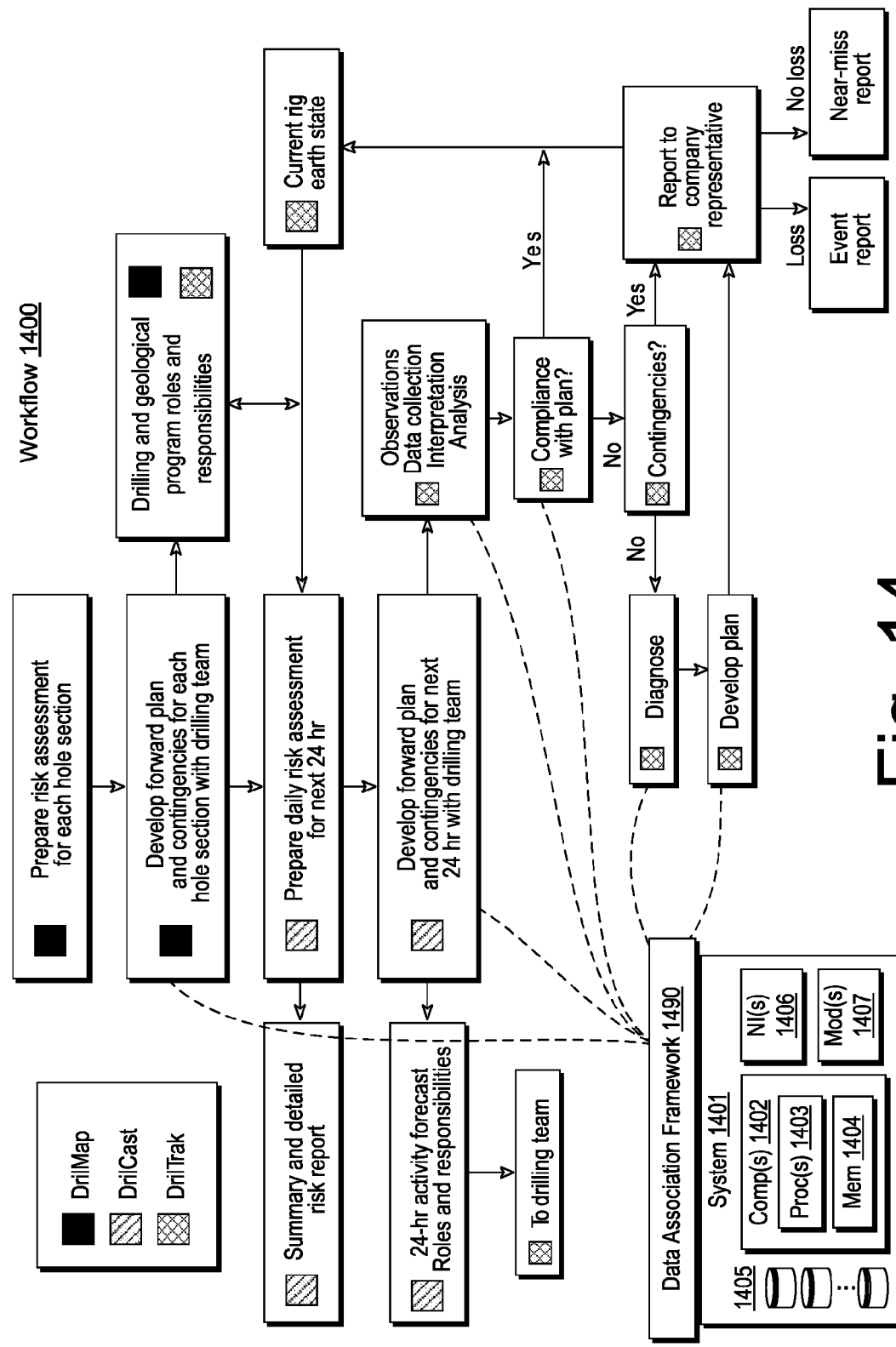
FIG. 14 illustrates an example of a workflow, an example of a framework and an example of a system.

FIG. 14 shows an example of a workflow 1400 associated with field operations that include drilling where a data association framework 1490 may be utilized to associate data, provide information as to associated data, etc., with respect to one or more actions of the workflow 1400, some examples of which are illustrated via dashed lines. As shown, the workflow 1400 can include a block for one or more of observations, data collection, interpretation, analysis, etc. Another block can be for determining whether compliance exists with a plan. Yet another block can be for deciding whether one or more contingencies exist. As an example, a block can be provided for diagnosis and a block can be provided for plan development (e.g., plan revision, etc.). As an example, one or more blocks may include accessing the data association framework 1490, for example, to associate, assess, etc., depth-time information and optionally related information (e.g., depth-time data and metadata, etc.).

FIG. 14 also shows an example of a system 1401. As shown in FIG. 14, the system 1401 includes one or more computers 1402, one or more storage devices 1405, one or more networks 1406 and one or more modules 1407. As to the one or more computers 1402, each computer may include one or more processors (e.g., or processing cores) 1403 and memory 1404 for storing instructions (e.g., modules), for example, executable by at least one of the one or more processors. As an example, a computer may include one or more network interfaces (e.g., wired or wireless), one or more graphics cards, a display interface (e.g., wired or wireless), etc. As an example, data may be provided in the storage device(s) 1405 where the computer(s) 1402 may access the data via the network(s) 1406 and process the data via the module(s) 1407, for example, as stored in the memory 1404 and executed by the processor(s) 1403.

As an example, data (e.g., sensed data, measured data, observation data, etc.) may come from one or more systems (e.g., individual, mechanical, computerized, etc.). As an example, a system may be associated with an entity such as a corporate entity. As an example, data may be for one or more purposes, optionally including one or more regulatory purposes.

As an example, data and related information may include names of wells/well sites, company names, individual names, dates, times, types of equipment, etc. As an example, a data association framework may include matching of such data, for example, to identify data associated with a particular well that has depths drilled over a span of time.

As an example, depth may be a drill bit depth measured (e.g., or estimated) as a length into a borehole. As an example, data may be multidimensional, for example, available in terms of two or more dimensions. As an example, depth data may be specified in at least one dimension. As an example, depth data may be specified in a Cartesian coordinate system, a cylindrical coordinate system, or one or more other coordinate systems.

As an example, data may be acquired, recorded, etc. periodically, relatively continuously, etc. As an example, data may be one or more of pipe length data, mud logging data, etc. As an example, data may be acquired at a rig of a drilling site. An observation may be made and recorded as to how much pipe has been inserted into a borehole. As an example, gaps may exist in one or more sets of time series data. As an example, an offset or offsets may exist in one or more sets of time series data. As an example, associated data may be tagged with an identifier, which may optionally be a GUID or, for example, a local ID associated with a site that includes multiple boreholes/wells. As an example, a well may be a production well, an injection well, an exploratory well, a measurement well, etc.

Figure 15:
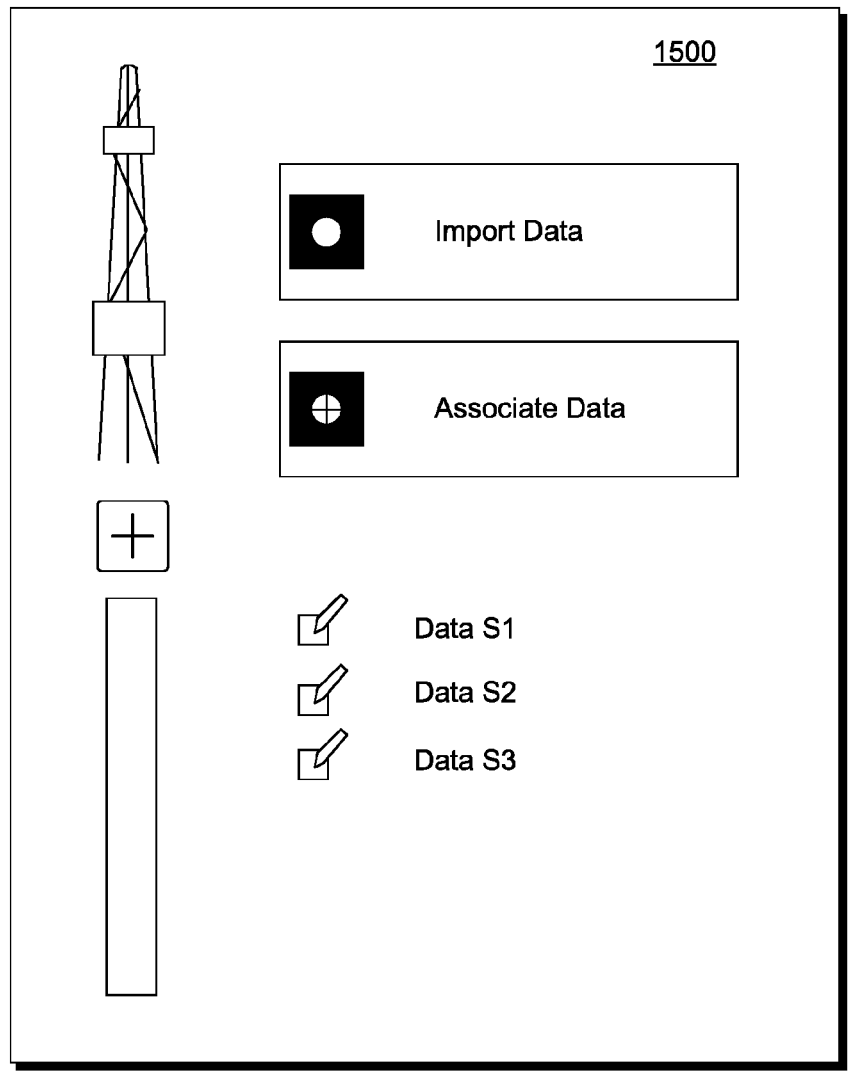
FIG. 15 illustrates an example of a graphical user interface.

FIG. 15 shows an example of a graphical user interface 1500 that includes a control for importing data and a control for associating data. As an example, the import control may be actuated for importation of data s1, s2 and s3 and the association control may be actuated for determining whether associations exist between such imported data, optionally with respect to other data. As an example, a merge operation may be utilized to merge data to create a more "complete" depth versus time profile (e.g., curve) for a borehole.

As an example, a method can include establishing an Internet of Things (IoT) hub or hubs. As an example, such a hub or hubs can include one or more device registries. In such an example, the hub or hubs may provide for storage of metadata associated with a device. As an example, where location information indicates that a device (e.g., wellsite equipment, etc.) has been changed with respect to its location, a method can include revoking the device in a hub.

As an example, an architecture utilized in a system may include features of the AZURE™ architecture (Microsoft Corporation, Redmond, Wash.). As an example, the cloud portal can include one or more features of an AZURE™ portal that can manage, mediate, etc. access to one or more services, data, connections, networks, devices, etc.

As an example, a system can include a cloud computing platform and infrastructure, for example, for building, deploying, and managing applications and services (e.g., through a network of datacenters, etc.). As an example, such a cloud platform may provide PaaS and IaaS services and support one or more different programming languages, tools and frameworks, etc.

FIG. 16 shows an example of a system 1600 associated with an example of a wellsite system 1601 and also shows an example scenario 1602. As shown in FIG. 16, the system 1600 can include a front-end 1603 and a back-end 1605 from an outside or external perspective (e.g., external to the wellsite system 1601, etc.). In the example of FIG. 16, the system 1600 includes a drilling framework 1620, a stream processing and/or management block 1640, storage 1660 and optionally one or more other features that can be defined as being back-end features. In the example of FIG. 16, the system 1600 includes a drilling workflow framework 1610, a stream processing and/or management block 1630, applications 1650 and optionally one or more other features that can be defined as being front-end features.

As an example, a user operating a user device can interact with the front-end 1603 where the front-end 1603 can interact with one or more features of the back-end 1605. As an example, such interactions may be implemented via one or more networks, which may be associated with a cloud platform (e.g., cloud resources, etc.).

As to the example scenario 1602, the drilling framework 1620 can provide information associated with, for example, the wellsite system 1601. As shown, the stream blocks 1630 and 1640, a query service 1685 and the drilling workflow framework 1610 may receive information and direct such information to storage, which may include a time series database 1662, a blob storage database 1664, a document database 1666, a well information database 1668, a project(s) database 1669, etc. As an example, the well information database 1668 may receive and store information such as, for example, customer information (e.g., from entities that may be owners of rights at a wellsite, service providers at a wellsite, etc.). As an example, the project database 1669 can include information from a plurality of projects where a project may be, for example, a wellsite project.

As an example, the system 1600 can be operable for a plurality of wellsites, which may include active and/or inactive wellsites and/or, for example, one or more planned wellsites.

As an example, the system 1600 can include one or more application programming interfaces (APIs). As an example, a data handling portion of the system 1600 can allow for access to data via one or more APIs. As an example, one or more query services may be accessible via one or more APIs. As an example, an API may provide for access to data and/or services that may be particular to a type of equipment or types of equipment. As an example, an API may be particular to depth data where, for example, an API call may specify a depth range and a return to an API call may include data or a link to data that corresponds to the specified depth range. As an example, a system can include one or more features of a framework such as, for example, the STUDIO™ framework.

Figure 17:
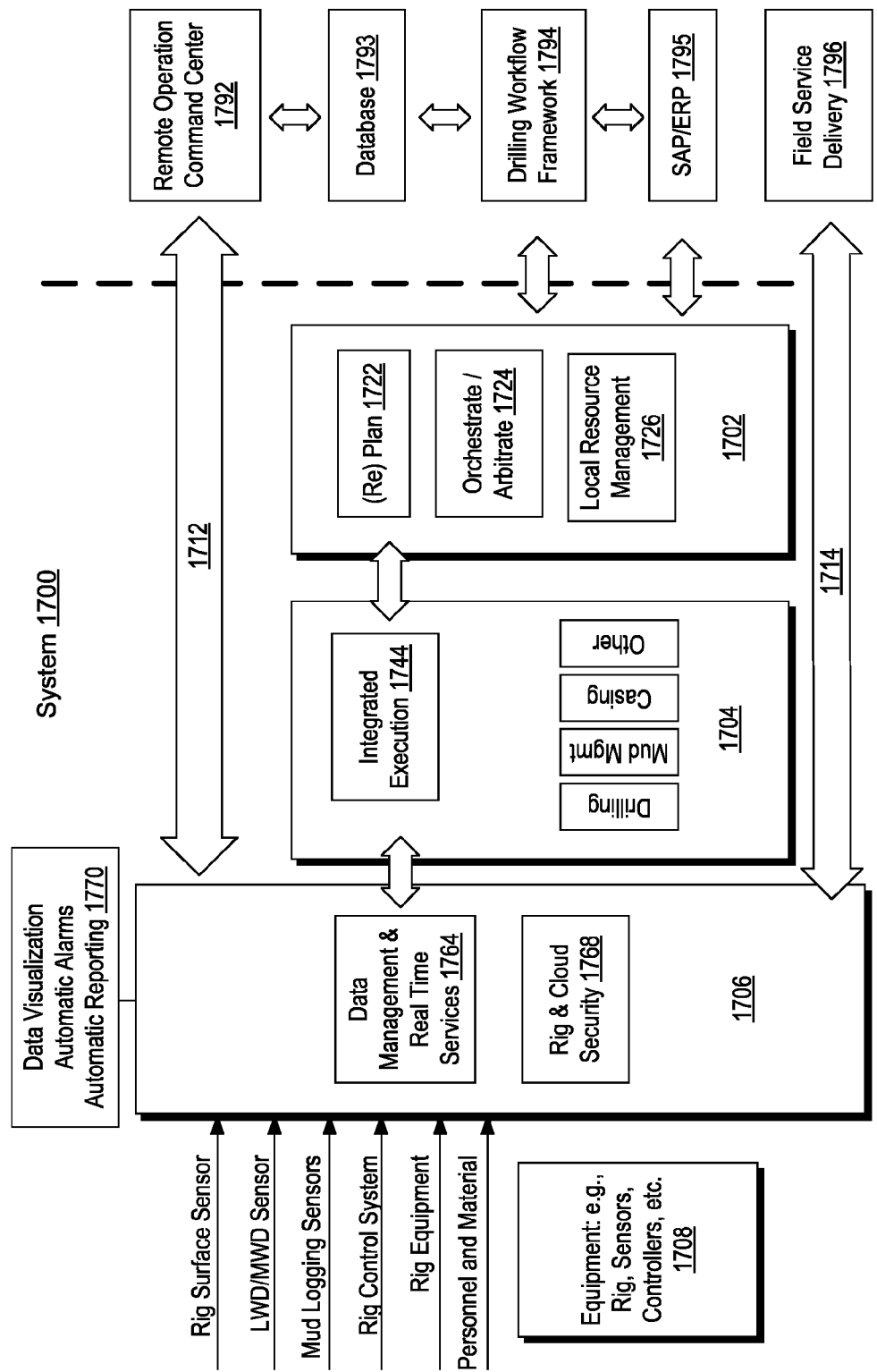
FIG. 17 illustrates an example of a system.

FIG. 17 shows an example of a system 1700 that includes various components that can be local to a wellsite and includes various components that can be remote from a wellsite. As shown, the system 1700 includes a block 1702, an block 1704, a block 1706 and an equipment block 1708. These blocks can be labeled in one or more manners other than as shown in the example of FIG. 17. In the example of FIG. 17, the blocks 1702, 1704, 1706 and 1708 can be defined by one or more of operational features, functions, relationships in an architecture, etc.

As an example, the block 1702 can be associated with a well management level (e.g., well planning and/or orchestration) and can be associated with a rig management level (e.g., rig dynamic planning and/or orchestration). As an example, the block 1704 can be associated with a process management level (e.g., rig integrated execution). As an example, the block 1706 can be associated with a data management level (e.g., sensor, instrumentation, inventory, etc.). As an example, the equipment block 1708 can be associated with a wellsite equipment level (e.g., wellsite subsystems, etc.).

In the example of FIG. 17, the block 1702 includes a plan/replan block 1722, an orchestrate/arbitrate block 1724 and a local resource management block 1726. In the example of FIG. 17, the block 1704 includes an integrated execution block 1744, which can include or be operatively coupled to blocks for various subsystems of a wellsite such as a drilling subsystem, a mud management subsystem (e.g., a hydraulics subsystem), a casing subsystem (e.g., casings and/or completions subsystem), and, for example, one or more other subsystems. In the example of FIG. 17, the block 1706 includes a data management and real-time services block 1764 (e.g., real-time or near real-time services) and a rig and cloud security block 1768. In the example of FIG. 9, the equipment block 1708 is shown as being capable of providing various types of information to the block 1706. For example, consider information from a rig surface sensor, a LWD/MWD sensor, a mud logging sensor, a rig control system, rig equipment, personnel, material, etc. In the example, of FIG. 17, a block 1770 can provide for one or more of data visualization, automatic alarms, automatic reporting, etc. As an example, the block 1770 may be operatively coupled to the block 1706 and/or one or more other blocks.

As mentioned, a portion of the system 1700 can be remote from a wellsite. For example, to one side of a dashed line appear a remote operation command center block 1792, a database block 1793, a drilling workflow framework block 1794, a SAP/ERP block 1795 and a field services delivery block 1796. Various blocks that may be remote can be operatively coupled to one or more blocks that may be local to a wellsite system. For example, a communication link 1712 is illustrated in the example of FIG. 17 that can operatively couple the blocks 1706 and 1792 (e.g., as to monitoring, remote control, etc.), while another communication link 1714 is illustrated in the example of FIG. 17 that can operatively couple the blocks 1706 and 1796 (e.g., as to equipment delivery, equipment services, etc.). Various other examples of possible communication links are also illustrated in the example of FIG. 17.

In the example of FIG. 17, various blocks can be components that may correspond to one or more software instruction sets (e.g., processor-executable instructions, add-ons, plug-ins, etc.), hardware infrastructure, firmware, equipment, or any combination thereof. Communication between the components may be local or remote, direct or indirect, via application programming interfaces, and procedure calls, or through one or more communication channels.

As an example, the block 1706 (e.g., a core services block) can include functionality to manage individual pieces of equipment and/or equipment subsystems. As an example, such a block can include functionality to handle basic data structure of the oilfield, such as the rig, acquire metric data, produce reports, and manages resources of people and supplies. As an example, such a block may include a data acquirer and aggregator, a rig state identifier, a real-time (RT) drill services (e.g., near real-time), a reporter, a cloud, and an inventory manager.

As an example, a data acquirer and aggregator can include functionality to interface with individual equipment components and sensor and acquire data. As an example, a data acquirer and aggregator may further include functionality to interface with sensors located at the oilfield.

As an example, a rig state identifier can includes functionality to obtain data from the data acquirer and aggregator and transform the data into state information. As an example, state information may include health and operability of a rig as well as information about a particular task being performed by equipment.

As an example, RT drill services can include functionality to transmit and present information to individuals. In particular, the RT drill services can include functionality to transmit information to individuals involved according to roles and, for example, device types of each individual (e.g., mobile, desktop, etc.). In one or more embodiments, information presented by RT drill services can be context specific, and may include a dynamic display of information so that a human user may view details about items of interest.

As an example, a wellsite "cloud" framework can correspond to an information technology infrastructure locally at an oilfield, such as an individual rig in the oilfield. In such an example, the wellsite "cloud" framework may be an "Internet of Things" (IoT) framework. As an example, a wellsite "cloud" framework can be an edge of the cloud (e.g., a network of networks) or of a private network.

In the example of FIG. 17, the equipment block 1708 can correspond to various controllers, control unit, control equipment, etc. that may be operatively coupled to and/or embedded into physical equipment at a wellsite such as, for example, rig equipment. For example, the equipment block 1708 may correspond to software and control systems for individual items on the rig. As an example, the equipment block 1708 may provide for monitoring sensors from multiple subsystems of a drilling rig and provide control commands to multiple subsystem of the drilling rig, such that sensor data from multiple subsystems may be used to provide control commands to the different subsystems of the drilling rig and/or other devices, etc. For example, a system may collect temporally and depth aligned surface data and downhole data from a drilling rig and transmit the collected data to data acquirers and aggregators in core services, which can store the collected data for access onsite at a drilling rig or offsite via a computing resource environment.

As an example, a system can include a framework that can acquire data such as, for example, real-time data associated with one or more operations such as, for example, a drilling operation or drilling operations. As an example, consider the PERFORM™ toolkit framework (Schlumberger Limited, Houston, Tex.).

As an example, a service can be or include one or more of OPTIDRILL™, OPTILOG™ and/or other services marketed by Schlumberger Limited, Houston, Tex.

The OPTIDRILL™ technology can help to manage downhole conditions and BHA dynamics as a real-time drilling intelligence service. The service can incorporate a rigsite display (e.g., a wellsite display) of integrated downhole and surface data that provides actionable information to mitigate risk and increase efficiency. Such data can be simultaneously interpreted by remote experts, who may collaborate with a drilling team to improve performance. As an example, such data may be stored, for example, to a database system (e.g., consider a database system associated with the STUDIO™ framework).

The OPTILOG™ technology can help to evaluate drilling system performance with single- or multiple-location measurements of drilling dynamics and internal temperature from a recorder. As an example, post-run data can be analyzed to provide input for future well planning.

As an example, information from a drill bit database may be accessed and utilized. For example, consider information from Smith Bits (Schlumberger Limited, Houston, Tex.), which may include information from various operations (e.g., drilling operations) as associated with various drill bits, drilling conditions, formation types, etc.

As an example, one or more QTRAC services (Schlumberger Limited, Houston Tex.) may be provided for one or more wellsite operations. In such an example, data may be acquired and stored where such data can include time series data that may be received and analyzed using one or more similarities metrics, etc.

As an example, one or more M-I SWACO™ services (M-I L.L.C., Houston, Tex.) may be provided for one or more wellsite operations. For example, consider services for value-added completion and reservoir drill-in fluids, additives, cleanup tools, and engineering. In such an example, data may be acquired and stored where such data can include time series data that may be received and analyzed using one or more similarities metrics, etc.

As an example, one or more ONE-TRAX™ services (e.g., via the ONE-TRAX software platform, M-I L.L.C., Houston, Tex.) may be provided for one or more wellsite operations. In such an example, data may be acquired and stored where such data can include time series data that may be received and analyzed using one or more similarities metrics, etc.

As an example, a framework can be implemented as a service that provides real-time tracking of steering and fatigue management in a time-depth log that can include rendering of graphical representation of a bottom hole assembly (BHA) of a tool string for drilling. As an example, such a framework can include a rig-state-detection engine that allows for analysis of drilling performance and continuous assessment of one or more factors. For example, consider assessment via one or more models such as a torque and drag model. As an example, a framework may organize and store data according to a format such as a comma separated values (CSV) format or one or more other formats.

As an example, a framework can acquire data organized by channels. In such an example, a channel may be associated with a tool and where a plurality of tools are utilized in an operation or operations associated with a well at a wellsite, channels may correspond to different individual tools at the wellsite.

As an example, a run may be performed at a wellsite such as an equipment run for drilling a well where equipment is tripped into the well and a BHA utilized to drill into a formation to form the well.

As an example, a method can include using a file name to locate individual channels for a run. As an example, a method can include extracting channels from individual files and/or jobs (e.g., runs, etc.). As an example, a method can include using time stamps to align different channels. As an example, a method can include evaluating relationship and different statistics of data of a plurality of channels.

As an example, a method can include generating a box plot for an individual file and/or job (e.g., a run, etc.). As an example, a method can include generating a histogram plot for an individual file and/or job (e.g., a run, etc.) and, for example, a global data set (e.g., for one or more jobs, runs, etc.). As an example, a method can include differentiating healthy runs from failed runs. As an example, a method can include identifying an individual bit run that may be in development.

As an example, a box plot can be a graphical depiction of groups of numerical data, for example, through quartiles. As an example, a box plot may include lines extending vertically from one or more boxes (e.g., whiskers) that indicate variability outside upper and lower quartiles (e.g., consider a box-and-whisker plot or a box-and-whisker diagram). As an example, outliers may be plotted as individual points. As an example, a box plot may be considered to be non-parametric in that it can display variation in samples of a statistical population without making an assumption as to an underlying statistical distribution. In a box plot, spacings between different parts of a box can indicate degree of dispersion (e.g., spread) and skewness in data and show outliers. In addition to points themselves, a box plot can allow one to visually estimate various L-estimators, notably the interquartile range, midhinge, range, mid-range, and trimean. As an example, a box plot may be drawn horizontally or vertically.

As to a histogram plot, it can be a graphical representation of a distribution of numerical data. As an example, a histogram plot can be an estimate of the probability distribution of a continuous variable (e.g., quantitative variable). As an example, to construct a histogram, a method can include binning a range of values (e.g., divide a range of values into a series of intervals) and counting how many values fall into each interval.

Figure 18:
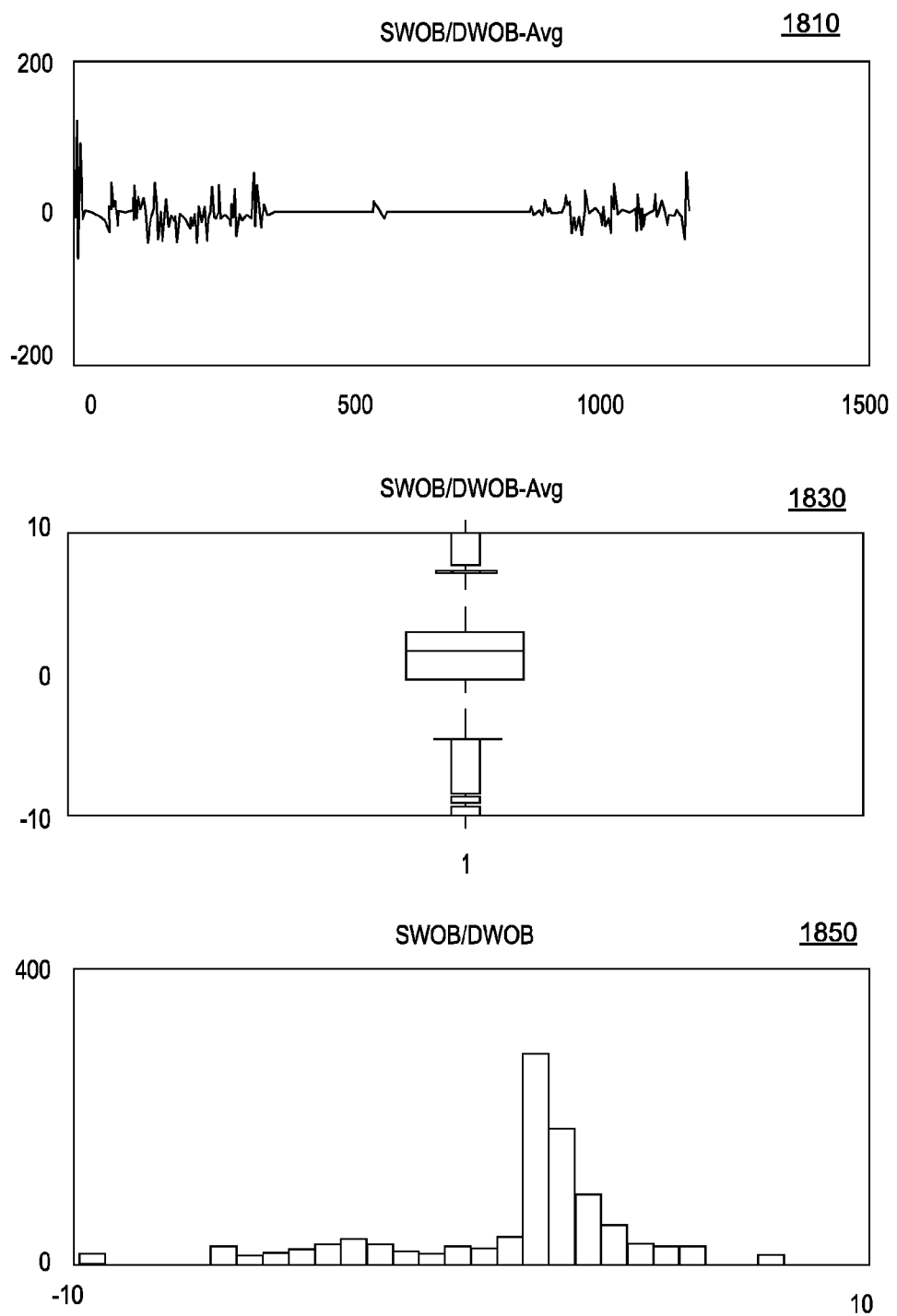
FIG. 18 illustrates example plots.

FIG. 18 shows an example of a time plot 1810, an example of a box plot 1830 and an example of a histogram plot 1850. In the example plots of FIG. 18, data are shown for downhole weight on bit (DWOB) and surface weight on bit (SWOB). As an example, a tool (e.g., an integrated weight on bit sub) may be utilized that can provide real-time DWOB and/or downhole torque at the bit (DTOR). As an example, data may be acquired via a drilling mechanics module (DMM), which may be part of a system, a framework, etc.

As an example, a weight on bit measurement (WOB) may be indicated in mass such as, for example, tons. As an example, a plot of WOB versus time may be generated from WOB data acquired with respect to time. As an example, one or more other measurements may be acquired with respect to time such as, for example, downhole rpm and/or surface rpm. As an example, an analysis of measurement data may indicate performance, wear, sticking, slipping, rate of penetration, etc.

As an example, at a particular time, a difference can exist between a DWOB value and a SWOB value. As an example, at a particular time, a difference can exist in a downhole rpm value and a surface rpm value. As an example, such a difference or differences may be analyzed to assess performance, wear, etc.

Referring again to the example plots 1810, 1830 and 1850 of FIG. 18, these plots present data associated with a DWOB/SWOB analysis of a PERFORM™ toolkit (PTK) framework data set. To generate the plots 1810, 1830 and 1850, a method included converting data from a native format to a CSV format. For example, a method can include accessing archived data associated with one or more wellsites and converting that data from one format to another format. As an example, a method can include identifying job and run number for a file. In such an example, the method may perform such identifying without pre-tagging of job number.

As mentioned, the plot 1810 shows a weight on bit data with respect to time, which can be considered to be a time series (e.g., time series data). Specifically, the plot 1810 shows the ratio of SWOB/DWOB-Average versus time while the plot 1830 is a box plot of that data and the plot 1850 is a histogram plot of that data.

Figure 19:
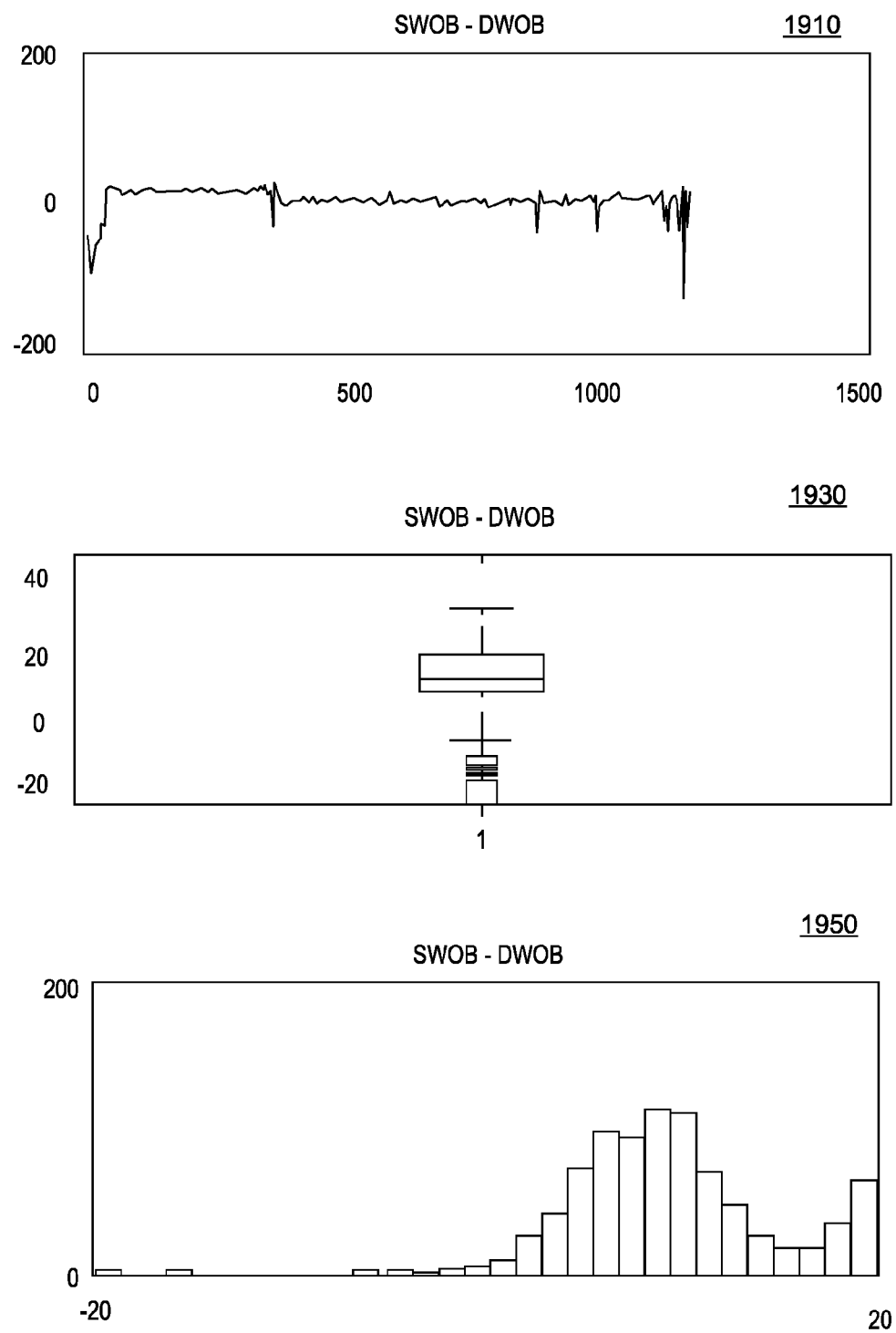
FIG. 19 illustrates example plots.

FIG. 19 shows an example of a time plot 1910, an example of a box plot 1930 and an example of a histogram plot 1950 for the data utilized in the plots 1810, 1830 and 1850 of FIG. 18 but specifically for a difference SWOB minus DWOB rather than the ratio SWOB/DWOB-Average.

In the histogram plot 1850, the ratio SWOB/DWOB-Average indicates that the data have a characteristic distribution (e.g., a distribution profile) with a spread predominantly between 0 and 5 (e.g., SWOB tends to be greater than DWOB). In the histogram plot 1950, the data have a characteristic distribution (e.g., a distribution profile) that spans from about 0 to about 20 where a peak exists at about 10 and another peak exists at about 20 (e.g., SWOB tends to be greater than DWOB). The plots 1810 and 1910 and the plots 1830 and 1930 also provide characteristics of the data.

As mentioned, a method can include receiving time series data and evaluating relationships and/or statistics for the data (e.g., as to one or more channels). In such a method, an analysis can include generating a time series plot of a metric, generating a box plot of a metric and/or generating a histogram plot of a metric. As an example, a method can include associating data based on one or more characteristics. As an example, a method can include differentiating health runs from failed runs based at least in part on one or more characteristics.

As an example, a method can include implementing an algorithm that utilizes geometry of an individual run (e.g., one or more of total vertical depth (TVD), trajectory length or depth, azimuth, etc.) and, for example, date in and date out as well as, for example, text analytics of well name and/or job number from text logic to identify the appropriate job run.

Figure 20:
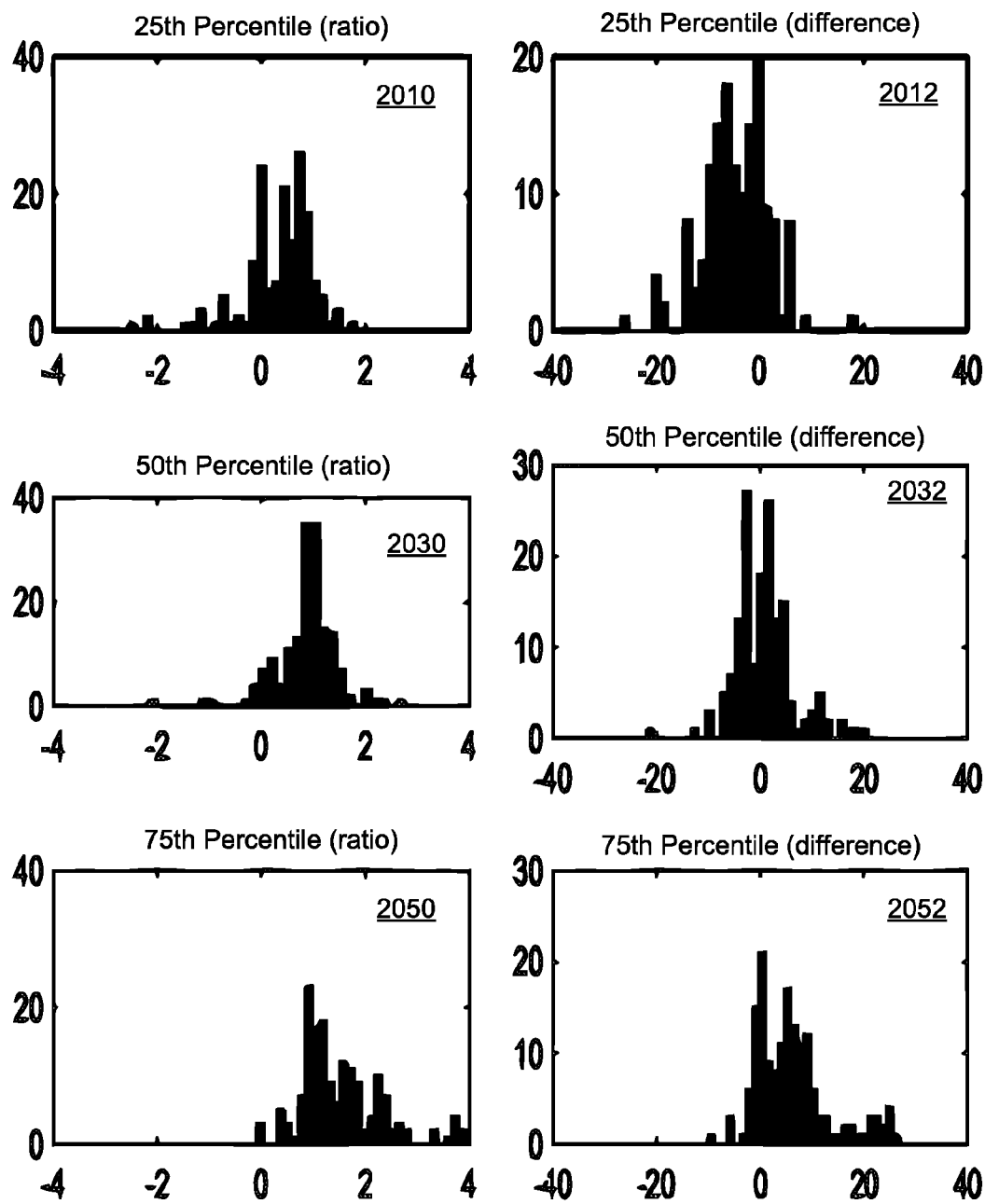
FIG. 20 illustrates example plots.

FIG. 20 shows a series of example histogram plots for SWOB/DWOB-Average ratio 2010, 2030 and 2050 (left column) and SWOB minus DWOB 2012, 2032 and 2052 (right column) for data from over 160 files where the plots 2010 and 2012 correspond to the 25th percentile, the plots 2030 and 2032 correspond to the 50th percentile and where the plots 2050 and 2052 correspond to the 75th percentile. These plots show characteristics for the data according to two different metrics and broken out for three different percentiles.

As an example, a method may include identifying data that are incorrectly stored or otherwise incorrectly associated with a job, a run, etc. For example, by examination of outliers, a file may be determined to include data that does not correspond to other files associated with a job, a run, etc. As an example, a method may include uncovering a file as being associated with a job number in a DMM archive where the file is tagged incorrectly.

As an example, a method can include loading a DMM data set (e.g., multiple data files) into a system and analyzing the data (e.g., consider one or more of PTK data, slow RM data and fast RM data). As an example, a method can include synchronizing PTK data with RM data.

As an example, a method can include receiving time series data and analyzing at least a portion of the time series data. In such an example, the method can include associating data and/or identifying data that is not associated with other data. For example, time series data from one or more channels may be analyzed, optionally as one or more metrics, where characteristics (e.g., fingerprints, etc.) may indicate whether data are associated or not. As an example, a method can include identifying positive outcomes and negative outcomes based at least in part on one or more characteristics (e.g., fingerprints, etc.).

As an example, a method can include receiving data that is time indexed such that the data can be considered to be time series data. As an example, such data may be analyzed with respect to one or more other sets of time series data. As an example, a job may be identified and/or associated with a characteristic or characteristics based on time series data. As an example, a method can include performing tool diagnostics based at least in part on an analysis of a plurality of sets of time series data. As an example, one set of time series data may differ in resolution than another set of time series data (e.g., sampled on a daily basis, sampled at intervals of a few seconds, etc.).

As an example, a method may be implemented as background process that can access sets of time series data in one or more data stores and analyze the sets of time series data. As an example, a method may be implemented on a daily or other basis for time series data generated at a wellsite, for example, as may be acquired using equipment at the wellsite, which may include surface equipment and/or downhole equipment. As an example, a measure of depth may be utilized for analyzing data. In such an example, the measure of depth may correspond to time, for example, as in one or more sets of time series data.

Figure 21:
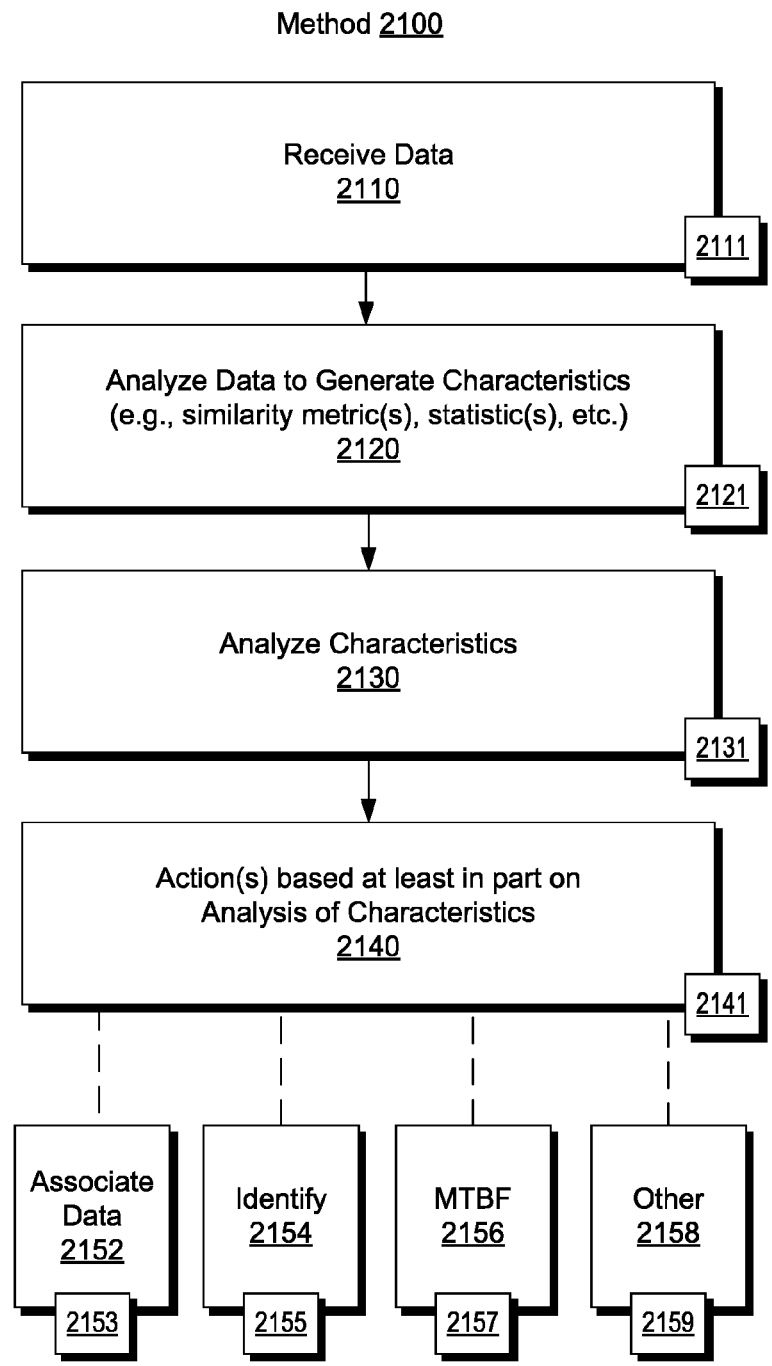
FIG. 21 illustrates an example of a method.

FIG. 21 shows an example of a method 2100 that includes a reception block 2110 for receiving data, an analysis block 2120 for analyzing at least a portion of the data to generate characteristics (e.g., one or more similarity metrics, statistics, etc.), an analysis block 2130 for analyzing at least a portion of the characteristics and an action block 2140 for performing one or more actions based at least in part on the analysis of at least a portion of the characteristics. As shown in the example of FIG. 21, performing an action may include associating data per an association block 2152, identifying data per an identification block 2154, determining a mean-time between failures (MTBF) or other equipment performance, service or longevity metric, and an other block 2158 for performing one or more other actions.

As an example, the method 2100 can include receiving data as time series data where data values are accompanied by time information (e.g., time stamps, etc.). As an example, data may be accompanied by geometric information that corresponds to geometry of a bore in a geologic environment. For example, a well trajectory may be specified at least in part by geometric information, which may be, for example, spatial information related to one or more coordinate systems. As an example, the method 2100 can include accessing stored information such as, for example, stored characteristics and/or stored analysis results.

As an example, the method 2100 may be implemented as part of a workflow. For example, consider the example workflow 1400 of FIG. 14 where the data association framework 1490 may be utilized to implement at least a portion of the method 2100 and/or at least a portion of one or more other methods (e.g., the method 700, the method 900, etc.).

As an example, the method 2100 may be implemented in conjunction with the system 1600 of FIG. 16 where, for example, a plurality of wellsites may be involved. As an example, the method 2100 may be implemented in conjunction with a scenario such as the scenario 1602 of FIG. 16. For example, the method 2100 may utilize one or more services to access data, receive data, etc. As an example, one or more actions may be performed at a wellsite based at least in part on information generated by the method 2100. As an example, well planning may be performed based at least in part on information generated by the method 2100.

As an example, the method 2100 may be implemented as a portion of a system such as the system 1700 of FIG. 17 or, for example, implemented in a manner whereby data and/or actions may be taken with respect to equipment (see, e.g., the equipment block 1708) at one or more wellsites and/or other sites.

As an example, a system can include a processor; memory accessibly by the processor; a network interface; and processor-executable instructions stored in the memory to instruct the system wherein the instructions include instructions to: receive time series data associated with a borehole; compute a similarity metric for at least a portion of the time series data with respect to other time series data for the borehole; and analyze the similarity metric with respect to at least one operation associated with the borehole (e.g., a job, a drilling operation, a completions operation, a fracturing operation, an injection operation, a production operation, etc.). In such an example, one or more actions may be taken based at least in part on the analysis of the similarity metric. For example, consider matching at least a portion of time series data to at least a portion of other time series data based at least in part on the similarity metric. In such an example, the matching may link data, tag data (e.g., with metadata, etc.), associate data, etc. for one or more operations that are associated with a borehole. As an example, one or more operations may be one or more operations of a job or jobs performed at a wellsite. As an example, such time series data and other time series data may be from two different sources, which may be two different service companies at a wellsite collecting time series data, for example, using different equipment (e.g., first equipment of a first service company and second equipment of a second service company).

As an example, a system can include instructions to control a field operation with respect to a borehole based at least in part on an analysis of a similarity metric, which may include matching of at least a portion of time series data to at least a portion of other time series data. As an example, a field operation may be a drilling operation, a completions operation, a fracturing operation, an injection operation or a production operation.

As an example, a similarity metric can be or can include a statistic. As an example, a statistic can be a box plot statistic or a histogram plot statistic or another type of statistic.

As an example, time series data can include surface condition data, downhole condition data or surface condition data and downhole condition data.

As an example, a method can include receiving data for one or more operations associated with a wellsite. In such an example, the data can include data acquired by one or more tools where, for example, such tool acquired data may include data values for one or more sensor-based measurements and corresponding time stamps (e.g., a time index, etc.). Such data may be akin to "black box" data for a tool (e.g., internal data recorder, etc.). As an example, tool data may be related to a job but the data may be transmitted and stored without job metadata. In such an example, the job may not be known to one that accesses the stored data. As an example, a method can include analyzing the stored data with respect to other data and matching the data based at least in part on one or more similarity metrics. In such an example, tool data (e.g., or other data) that is not stored with metadata (e.g., or sufficient metadata) may be analyzed and associated with a job.

As an example, black box tool data may include information as to tool health, including, for example, tool failure. As an example, such data may include information as to mechanical impacts such as, for example, shocks. As an example, a tool may be expected to handle a predetermined amount and/or type of mechanical impacts. As an example, such data may be analyzed for a plurality of tools and a plurality of jobs where a job is not known (e.g., due to a lack of metadata), a method can include analyzing at least a portion of the data to associate it with job (e.g., or jobs where the tool has performed multiple jobs).

Referring again to the method 2100 of FIG. 21, it is shown in association with various computer-readable media (CRM) 2111, 2121, 2131, 2141, 2153, 2155, 2157 and 2159. Such blocks generally include instructions suitable for execution by one or more processors (or processor cores) to instruct a computing device or system to perform one or more actions. While various blocks are shown, a single medium may be configured with instructions to allow for, at least in part, performance of various actions of the method 2100. As an example, a computer-readable medium (CRM) may be a computer-readable storage medium that is non-transitory and that is not a carrier wave.

As an example, a system can include a processor; memory accessibly by the processor; a network interface; and processor-executable instructions stored in the memory to instruct the system where the instructions include instructions to receive time series data associated with a borehole; compute a similarity metric for at least a portion of the time series data with respect to other time series data for the borehole; and match at least a portion of the time series data to at least a portion of the other time series data based at least in part on the similarity metric and/or analyze the similarity metric with respect to at least one operation associated with the borehole (e.g., a job, a drilling operation, a completions operation, a fracturing operation, an injection operation, a production operation, etc.). In such an example, the time series data can include measured depth with respect to time (e.g., bore penetration data). As an example, sets of time series data can be from different sources.

As an example, system can include instructions to compute a Euclidean distance based similarity metric. As an example, a system can include instructions to compute a shift in time. As an example, a system can include instructions to filter (e.g., and to generate one or more filters).

As an example, a system can include instructions to assess a borehole based at least in part on a match of at least a portion of time series data to at least a portion of other time series data.

As an example, a system can include instructions to control a field operation with respect to a borehole based at least in part on a match of at least a portion of time series data to at least a portion of other time series data. In such an example, a field operation may be a drilling operation, a completions operation, a fracturing operation, an injection operation, a production operation, etc.

As an example, a method can include receiving time series data from a first source associated with an operation for a borehole; receiving time series data from a second source associated with an operation for the borehole; computing a similarity metric based at least in part on a portion of the time series data from the first source and based at least in part on a portion of the time series data from the second source; and matching at least a portion of the time series data from the first source to at least a portion of the time series data from the second source based at least in part on the similarity metric. In such an example, the operation can be a drilling operation.

As an example, matching can include associating data. As an example, data may be from more than two sources. As an example, at least one source can be a database (e.g., associated with an entity, etc.). As an example, a database can include a plurality of sets of time series data.

As an example, one or more computer-readable media that can include processor-executable instructions where the instructions include instructions executable to instruct a computing device to: receive time series data associated with a borehole; compute a similarity metric for at least a portion of the time series data with respect to other time series data for the borehole; and match at least a portion of the time series data to at least a portion of the other time series data based at least in part on the similarity metric and/or analyze the similarity metric with respect to at least one operation associated with the borehole (e.g., a job, a drilling operation, a completions operation, a fracturing operation, an injection operation, a production operation, etc.). In such an example, instructions can be included that are executable to instruct the computing device to associate the matched data.

Figure 22:
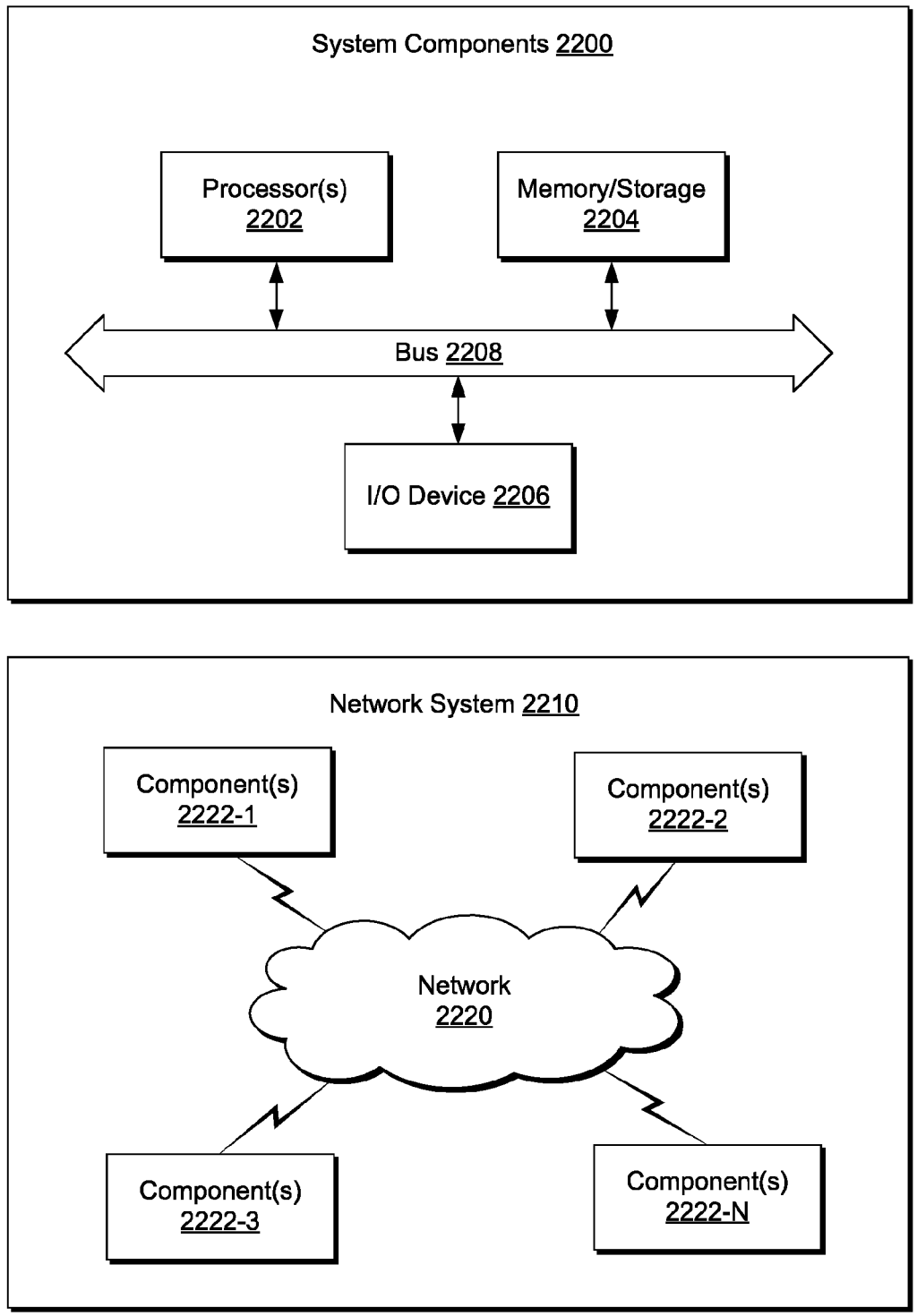
FIG. 22 illustrates example components of a system and a networked system.

FIG. 22 shows components of an example of a computing system 2200 and an example of a networked system 2210. The system 2200 includes one or more processors 2202, memory and/or storage components 2204, one or more input and/or output devices 2206 and a bus 2208. In an example embodiment, instructions may be stored in one or more computer-readable media (e.g., memory/storage components 2204). Such instructions may be read by one or more processors (e.g., the processor(s) 2202) via a communication bus (e.g., the bus 2208), which may be wired or wireless. The one or more processors may execute such instructions to implement (wholly or in part) one or more attributes (e.g., as part of a method). A user may view output from and interact with a process via an I/O device (e.g., the device 2206). In an example embodiment, a computer-readable medium may be a storage component such as a physical memory storage device, for example, a chip, a chip on a package, a memory card, etc. (e.g., a computer-readable storage medium).

In an example embodiment, components may be distributed, such as in the network system 2210. The network system 2210 includes components 2222-1, 2222-2, 2222-3, . . . , 2222-N. For example, the components 2222-1 may include the processor(s) 2202 while the component(s) 2222-3 may include memory accessible by the processor(s) 2202. Further, the component(s) 2222-2 may include an I/O device for display and optionally interaction with a method. The network may be or include the Internet, an intranet, a cellular network, a satellite network, etc.

As an example, a device may be a mobile device that includes one or more network interfaces for communication of information. For example, a mobile device may include a wireless network interface (e.g., operable via IEEE 802.11, ETSI GSM, BLUETOOTH™, satellite, etc.). As an example, a mobile device may include components such as a main processor, memory, a display, display graphics circuitry (e.g., optionally including touch and gesture circuitry), a SIM slot, audio/video circuitry, motion processing circuitry (e.g., accelerometer, gyroscope), wireless LAN circuitry, smart card circuitry, transmitter circuitry, GPS circuitry, and a battery. As an example, a mobile device may be configured as a cell phone, a tablet, etc. As an example, a method may be implemented (e.g., wholly or in part) using a mobile device. As an example, a system may include one or more mobile devices.

As an example, a system may be a distributed environment, for example, a so-called "cloud" environment where various devices, components, etc. interact for purposes of data storage, communications, computing, etc. As an example, a device or a system may include one or more components for communication of information via one or more of the Internet (e.g., where communication occurs via one or more Internet protocols), a cellular network, a satellite network, etc. As an example, a method may be implemented in a distributed environment (e.g., wholly or in part as a cloud-based service).

As an example, information may be input from a display (e.g., consider a touchscreen), output to a display or both. As an example, information may be output to a projector, a laser device, a printer, etc. such that the information may be viewed. As an example, information may be output stereographically or holographically. As to a printer, consider a 2D or a 3D printer. As an example, a 3D printer may include one or more substances that can be output to construct a 3D object. For example, data may be provided to a 3D printer to construct a 3D representation of a subterranean formation. As an example, layers may be constructed in 3D (e.g., horizons, etc.), geobodies constructed in 3D, etc. As an example, holes, fractures, etc., may be constructed in 3D (e.g., as positive structures, as negative structures, etc.).

Although only a few example embodiments have been described in detail above, those skilled in the art will readily appreciate that many modifications are possible in the example embodiments. Accordingly, all such modifications are intended to be included within the scope of this disclosure as defined in the following claims. In the claims, means-plus-function clauses are intended to cover the structures described herein as performing the recited function and not only structural equivalents, but also equivalent structures. Thus, although a nail and a screw may not be structural equivalents in that a nail employs a cylindrical surface to secure wooden parts together, whereas a screw employs a helical surface, in the environment of fastening wooden parts, a nail and a screw may be equivalent structures. It is the express intention of the applicant not to invoke 35 U.S.C. § 112, paragraph 6 for any limitations of any of the claims herein, except for those in which the claim expressly uses the words "means for" together with an associated function.

What is claimed is:

1. A system comprising:
    a processor;
    memory accessible by the processor;
    a network interface; and
    processor-executable instructions stored in the memory to instruct the system wherein the instructions comprise instructions to:
        receive time series data associated with a borehole;
        compute a similarity metric for at least a portion of the time series data with respect to other time series data for the borehole, wherein the similarity metric comprises a statistic, and wherein the statistic comprises one or both of a box plot statistic and a histogram plot statistic; and
        analyze the similarity metric with respect to at least one operation associated with the borehole.

2. The system of claim 1 comprising instructions to match at least a portion of the time series data to at least a portion of the other time series data based at least in part on the similarity metric.

3. The system of claim 1 wherein the time series data comprises measured depth with respect to time.

4. The system of claim 1 wherein the time series data and the other time series data are from different sources.

5. The system of claim 1 wherein the similarity metric comprises a Euclidean distance based similarity metric.

6. The system of claim 1 wherein the instructions to compute comprise instructions to shift in time.

7. The system of claim 1 wherein the instructions to compute comprise instructions to filter.

8. The system of claim 1 comprising instructions to control a field operation with respect to the borehole based at least in part on the analysis of the similarity metric.

9. The system of claim 8 wherein the field operation comprises a drilling operation, a completions operation, a fracturing operation, an injection operation or a production operation.

10. The system of claim 1 wherein the time series data comprise surface condition data, downhole condition data or surface condition data and downhole condition data.

11. A method comprising:
receiving time series data from a first source associated with an operation for a borehole;
receiving time series data from a second source associated with an operation for the borehole;
computing a similarity metric based at least in part on a portion of the time series data from the first source and based at least in part on a portion of the time series data from the second source, wherein the similarity metric comprises a statistic, and wherein the statistic comprises one or both of a box plot statistic and a histogram plot statistic; and
matching at least a portion of the time series data from the first source to at least a portion of the time series data from the second source based at least in part on the similarity metric.

12. The method of claim 11 wherein the operation comprises a drilling operation.

13. The method of claim 12 wherein the matching comprises associating data.

14. The method of claim 12 comprising receiving time series data from a third source.

15. The method of claim 12 wherein at least one of the sources comprises a database.

16. The method of claim 15 wherein the database comprises a plurality of sets of time series data.

17. One or more computer-readable media that comprise processor-executable instructions wherein the instructions comprise instructions executable to instruct a computing device to:
receive time series data associated with a borehole;
compute a similarity metric for at least a portion of the time series data with respect to other time series data for the borehole, wherein the similarity metric comprises a statistic, and wherein the statistic comprises one or both of a box plot statistic and a histogram plot statistic; and
match at least a portion of the time series data to at least a portion of the other time series data based at least in part on the similarity metric.

18. The one or more computer-readable media of claim 17 comprising instructions executable to instruct the computing device to associate the matched data.

\* \* \* \* \*